(12) United States Patent
Mittal et al.

(10) Patent No.: US 8,972,807 B2
(45) Date of Patent: Mar. 3, 2015

(54) INTEGRATED CIRCUITS CAPABLE OF GENERATING TEST MODE CONTROL SIGNALS FOR SCAN TESTS

(75) Inventors: Rajesh Mittal, Bangalore (IN); Puneet Sabbarwal, Agra (IN); Prakash Narayanan, Bangalore (IN); Rubin Ajit Parekhji, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 404 days.

(21) Appl. No.: 13/470,863

(22) Filed: May 14, 2012

(65) Prior Publication Data

US 2013/0305106 A1    Nov. 14, 2013

(51) Int. Cl.
*G01R 31/28* (2006.01)
*G01R 31/3185* (2006.01)
*G01R 31/3183* (2006.01)
*G01R 31/3177* (2006.01)

(52) U.S. Cl.
CPC .... *G01R 31/318555* (2013.01); *G01R 31/3183* (2013.01); *G01R 31/318533* (2013.01); *G01R 31/318544* (2013.01); *G01R 31/318536* (2013.01); *G01R 31/318569* (2013.01); *G01R 31/318594* (2013.01); *G01R 31/3177* (2013.01)
USPC ............ 714/726; 714/724; 714/727; 714/729

(58) Field of Classification Search
CPC .................. G01R 31/3183; G01R 31/318533; G01R 31/318536; G01R 31/318544; G01R 31/318555; G01R 31/318569; G01R 31/318594; G01R 31/3177
USPC .................................. 714/724, 726, 727, 729
See application file for complete search history.

(56) References Cited

U.S. PATENT DOCUMENTS

| | | | |
|---|---|---|---|
| 7,228,262 B2 * | 6/2007 | Anzou et al. | 703/14 |
| 7,334,172 B2 * | 2/2008 | Howard et al. | 714/726 |
| 7,380,189 B2 * | 5/2008 | Konuk | 714/731 |
| 7,945,830 B2 * | 5/2011 | Wang et al. | 714/726 |
| 8,332,698 B2 * | 12/2012 | Tang et al. | 714/726 |
| 8,412,991 B2 * | 4/2013 | Ackerman et al. | 714/726 |
| 8,560,904 B2 * | 10/2013 | Ackerman et al. | 714/726 |
| 8,635,503 B2 * | 1/2014 | Tang et al. | 714/726 |
| 2004/0003329 A1 | 1/2004 | Cote et al. | |
| 2005/0276321 A1 * | 12/2005 | Konuk | 375/224 |
| 2006/0085708 A1 * | 4/2006 | Howard et al. | 714/726 |

(Continued)

FOREIGN PATENT DOCUMENTS

| | | |
|---|---|---|
| JP | 2004-325124 | 11/2004 |
| JP | 2005-147772 | 6/2005 |

*Primary Examiner* — John J Tabone, Jr.
(74) *Attorney, Agent, or Firm* — Ronald O. Neerings; Frederick J. Telecky, Jr.

(57) ABSTRACT

Various embodiments of methods and integrated circuits capable of generating a test mode control signal for a scan test through a scan chain (such as in an integrated circuit) are provided. The integrated circuit includes a test pattern detection block, a counter circuit, and a control circuit. The test pattern detection block is configured to receive a detection pattern and to detect a first pattern corresponding to a shift phase and a second pattern corresponding to a capture phase of a test pattern based on the detection pattern and to generate a trigger signal based upon the detection of the patterns. The control circuit generates and controls the test mode control signal based on the count states. The counter circuit is configured to generate one or more count states corresponding to one of the shift phase, the capture phase and the clock signal based on the detected pattern.

20 Claims, 8 Drawing Sheets

(56) References Cited

U.S. PATENT DOCUMENTS

| | | |
|---|---|---|
| 2010/0218062 A1* | 8/2010 | Wang et al. .................. 714/731 |
| 2011/0099442 A1* | 4/2011 | Hales et al. .................. 714/729 |
| 2011/0185244 A1 | 7/2011 | Mikami |
| 2011/0289372 A1* | 11/2011 | Tang et al. .................. 714/731 |
| 2013/0061103 A1* | 3/2013 | Ackerman et al. ............ 714/726 |
| 2013/0067292 A1* | 3/2013 | Tang et al. .................. 714/727 |
| 2013/0219237 A1* | 8/2013 | Ackerman et al. ............ 714/727 |
| 2014/0115412 A1* | 4/2014 | Ackerman et al. ............ 714/727 |

\* cited by examiner

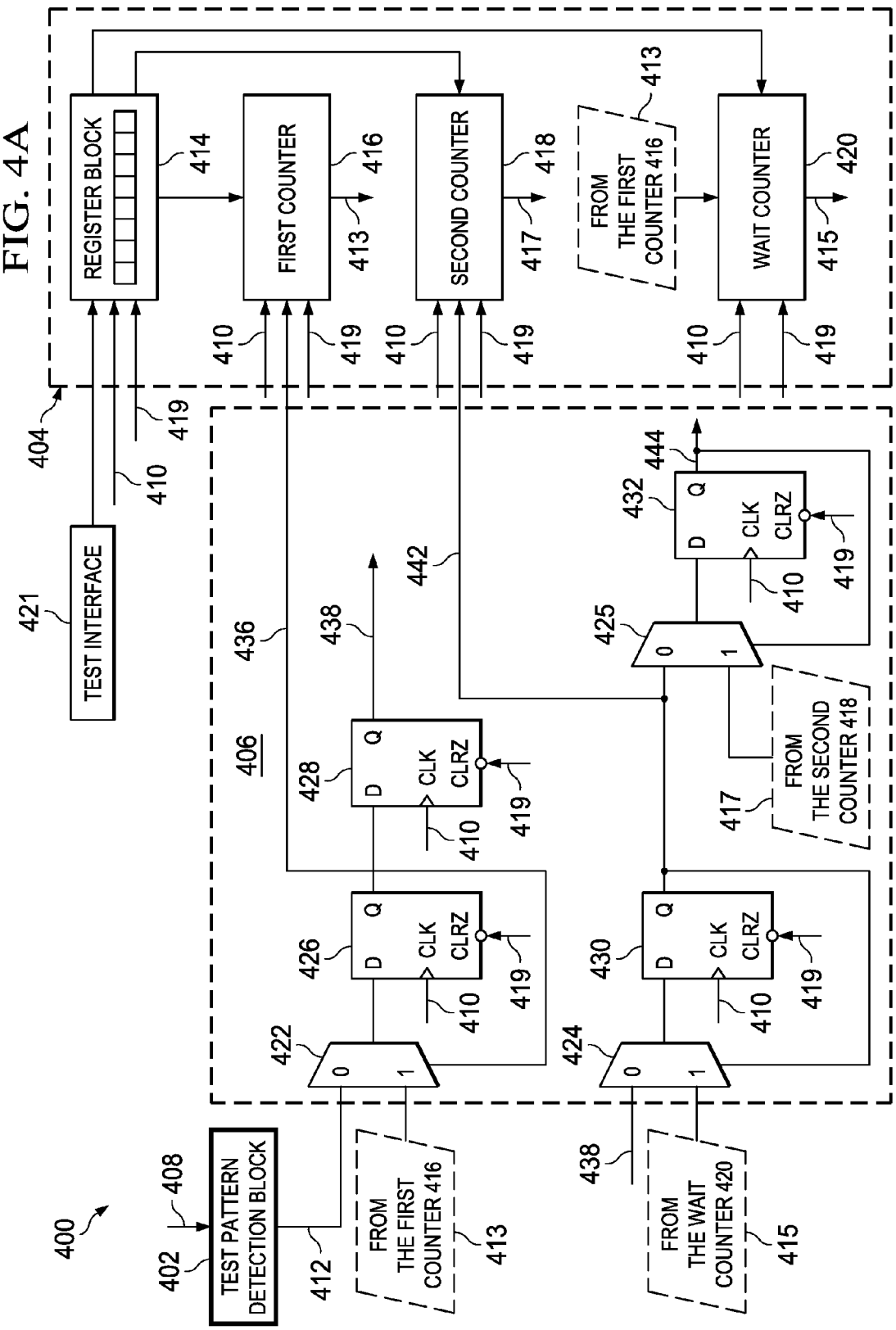

INTEGRATED CIRCUITS CAPABLE OF GENERATING TEST MODE CONTROL SIGNALS FOR SCAN TESTS

TECHNICAL FIELD

The present disclosure generally relates to scan control.

BACKGROUND

In accordance with an exemplary scenario, fabricated circuits are tested so as to verify that no input or output of a logic gate within the fabricated circuits gets stuck (or is maintained) at a fixed value (e.g., logic 0 or logic 1) during operation due to unforeseen circumstances, such as, for example, a short circuit. In order to mitigate the above-mentioned issues, the fabricated circuits are subjected to scan tests. The scan tests are performed on integrated circuits, including a combinatorial part and a sequential part. The sequential part may include a sequence of one or more storage elements (e.g. flip-flops). During a scan test, the storage elements constituting the sequential part of the integrated circuits are coupled or connected as a scan chain, and a test vector is transferred into the scan chain through one or more input test pins provided on the integrated circuit. The integrated circuit is placed in an evaluation mode (e.g., a capture phase) so as to cause one or more inputs and states of one or more storage elements to be evaluated, and a corresponding response vector obtained in the evaluation mode is shifted out through one or more output test pins. The bit values in the response vector are compared with an expected output so as to determine fault conditions in the integrated circuit.

SUMMARY

A number of exemplary methods and integrated circuits capable of generating a test mode control signal for a scan test through a scan chain in the integrated circuit are disclosed herein. The integrated circuit includes a test pattern detection block, a counter circuit and a control circuit. The test pattern detection block is configured to receive a detection pattern and detect a first pattern corresponding to a shift phase of the test pattern and a second pattern corresponding to a capture phase of the test pattern, based on the detection pattern. The test pattern detection block is also configured to generate a trigger signal based on the detection of at least one of the first and the second patterns. The counter circuit is configured to generate (1) one or more count states corresponding to the shift phase and a clock signal and (2) one or more count states corresponding to the capture phase and the clock signal based on the detected pattern. The control circuit is coupled with the test pattern detection block and is configured to receive the trigger signal and generate and control the test mode control signal based on the one or more count states corresponding to the shift phase and the one or more count states corresponding to the capture phase.

The control circuit is further configured to perform at least one of (1) assertion of the test mode control signal if the count state is one of the shift start count state and a capture end count state and (2) de-assertion of the test mode control signal if the count state is one of the capture start count state and a shift end count state. The counter circuit includes a register block and one or more counters. The register block is configured to store at least one of the shift start count state, the capture start count state, the shift end count state, and the capture end count state. The one or more counters coupled with the register block are configured to generate the one or more count states corresponding to the shift phase from the shift start count state to the shift end count state and generate the one or more count states corresponding to the capture phase from the capture start count state to the capture end count state.

Additionally, in an embodiment, an integrated circuit capable of generating a test mode control signal for a scan test through a scan chain in the integrated circuit is provided. The integrated circuit includes a test pattern detection block, a counter circuit, and a control circuit. The test pattern detection block is configured to receive a detection pattern, detect a pattern corresponding to a first shift phase of the test pattern based on the detection pattern, and generate a trigger signal based on the detection of the pattern. The counter circuit includes a pattern counter and one or more counters. The pattern counter is configured to be triggered upon the detection of the first shift phase and generate one or more count states corresponding to a pre-determined number of transitions between a shift start count state corresponding to one of the first shift phase and a subsequent shift phase to a capture end count state corresponding to the capture phase. The one or more counters are configured to generate count states corresponding to the subsequent shift phases and the capture phases. The control circuit is coupled with the counter circuit and the test pattern detection block and is configured to receive the trigger signal and generate and control the test mode control signal based on the one or more count states corresponding to the first shift phase, the count states corresponding to the one or more subsequent shift phases and the one or more capture phases.

Moreover, in an embodiment, a method of generating a test mode control signal for a scan test through a scan chain in an integrated circuit is provided. The method includes detecting one of a first pattern corresponding to a shift phase of a test pattern or the first pattern corresponding to the shift phase and a second pattern corresponding to a capture phase of the test pattern. One or more count states corresponding to each of the shift phase and the capture phase are generated through a counter circuit upon the detection of the patterns. The one or more count states corresponding to the shift phase includes count states between a shift start count state and a shift end count state. The shift start count state is associated with a number of cycles of a clock signal corresponding to the shift phase. The one or more count states corresponding to the capture phase includes count states between a capture start count state and a capture end count state, the capture start count state being associated with a number of cycles of the clock signal corresponding to the capture phase. The test mode control signal is generated and subsequently controlled based on the one or more count states corresponding to the shift phase and the one or more count states corresponding to the capture phase.

BRIEF DESCRIPTION OF THE FIGURES

FIG. 4A depicts a second exemplary integrated circuit capable of generating a test mode control signal for a scan test through a scan chain in the integrated circuit according to an embodiment;

Figure 1A:
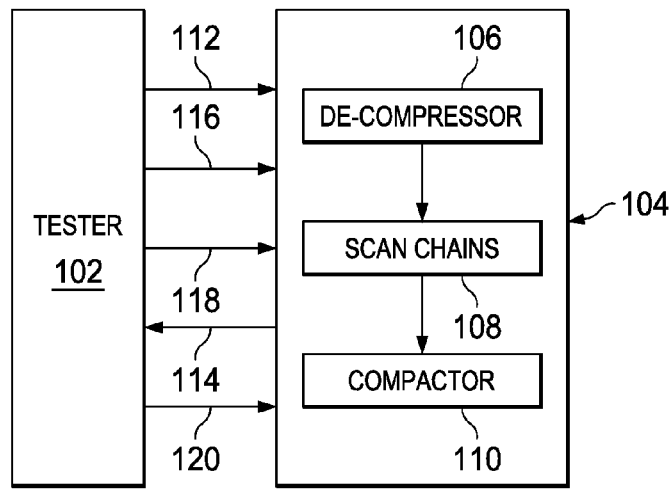
FIG. 1A is a block diagram depicting an exemplary environment for implementing various embodiments of the present technology in accordance with an embodiment.

The drawings referred to in this description are not to be understood as being drawn to scale except if specifically noted, and such drawings are only exemplary in nature.

DETAILED DESCRIPTION

Pursuant to an exemplary scenario, during a scan test of an integrated circuit, one or more test vectors are transmitted into a scan chain associated with the integrated circuit. The one or more test vectors are transmitted in the form of one or more test patterns from a tester through a set of pins. The set of pins include a scan data input pin, a scan data output pin, a clock signal pin and a scan enable pin. The scan data input pin and the scan data output pin function simultaneously such that a scan data input signal corresponding to a new test pattern is transmitted into the scan chain at the same instance as a scan data output signal corresponding to the previous pattern is transmitted out of the scan chain. The scan enable pin provides a distinction between a shift phase (during which the scan enable pin is asserted) and a capture phase (during which the scan enable pin is de-asserted) during the scan test. During the shift phase the scan data in the form of the test pattern is shifted into and out of the scan chain using the clock signal and during the capture phase the response of the integrated circuit for the scan data is captured in the scan chain using a functional clock. For a given number of storage elements in the scan chain and a given clock sequence of the clock signal, a test mode enable signal (e.g., a scan enable signal associated with the scan enable pin) has a fixed relation to the number of clock cycles of the clock signal. The assertion and de-assertion of the scan enable pin is, therefore, canonical for the various patterns in a given automatic test pattern generation (ATPG) run of a given type.

As a result, dynamic control of the test mode control signal on a per cycle basis from the tester and the scan enable pin is immaterial. In a reduced pin count test, where the integrated circuit must be tested through a small set of pins, the integrated circuit provides restricted pins to the tester and a few functional inputs and outputs are rendered unavailable. Also, depending upon the test pattern, a state of the scan data input pin and scan data output pin remains unchanged after the end of a shift operation and during a capture operation or may also change between end of the shift operation and end of the capture operation. Additionally, a dedicated device level pin, such as the scan enable pin, has to be driven (e.g., controlled) from the tester during the scan test, thereby leading to a resource being expended unnecessarily. Moreover, input/output channel speeds of the tester may restrict the speed at which the scan enable pin may be controlled, as well as the speed with which the test pattern may be shifted into and out of the integrated circuit. In the case of an event driven direct memory access based tester architecture, switching between the shift phase (e.g., scan data shifted into and out of the scan chain using the clock signal) and capture phase (e.g., an integrated circuit response captured in a scan chain using a functional clock) yields dead cycles between a last data shifted into the scan chain and the de-assertion of the test mode control signal, and between a last application of the capture clock and the assertion of the test mode control signal. The event driven direct memory access based tester architecture utilizes additional cycles to switch from shift phase to the capture phase and similarly from the capture phase to the shift phase. Various embodiments of the present technology, however, provide methods and integrated circuits capable of (1) internally generating a test mode control signal for a scan test through a scan chain (such as in the integrated circuit) and (2) overcoming these and other obstacles and providing additional benefits The following description and accompanying figures demonstrate that the present technology may be practiced, or otherwise implemented, in a variety of different embodiments. It should be noted, however, that the scope of the present technology is not limited to any or all of the embodiments disclosed herein. Indeed, one or more of the devices, features, operations, processes, characteristics, or other qualities of a disclosed embodiment may be removed, replaced, supplemented, or changed.

FIG. 1A is a block diagram depicting an exemplary environment for implementing various embodiments of the present technology. As depicted in FIG. 1A, a tester (102) is communicatively associated or coupled with an integrated circuit (104) through a plurality of communication paths (e.g., (112), (114), (116), (118), and (120)). It is noted that the integrated circuit (104) may be a system-on-chip (SoC). The integrated circuit (104) includes a de-compressor (106), a scan chain (108), and a compactor (110). The scan chain (108) includes one or more storage elements (e.g., flip-flops). The one or more storage elements may be coupled or connected as shift registers during a shifting-in of the one or more test vectors and a shifting-out of the one or more response vectors. During a scan test, the tester (102) provides one or more test vectors in compressed form on an input path (112) to the de-compressor (106) and receives one or more response vectors representing the captured results of the scan test in compressed form on an output path (114) from the compactor (110). The one or more response vectors contain the results (e.g., response bits) of an evaluation of a combinatorial logic of the integrated circuit (104) that is under test once or subsequent to the shifting-in of a test vector is complete (e.g., during a capture phase). The tester (102) may compare the bit values in the one or more response vectors with one or more expected values so as to determine faults in the integrated circuit (104). The tester (102) provides a test mode control signal on path (116) and one or more clocks through path (118) to the integrated circuit (104), the one or more clocks coordinating the operation of the integrated circuit (104) during the scan test. The tester (102) may also provide configuration data to specify a configuration of the one or more clocks, wherein the configuration data may be utilized to generate control signals in the integrated circuit (104) through output path (120).

The de-compressor (106) is configured to decompress the one or more test vectors received on the path (112) and provide the one or more test vectors in uncompressed form to the scan chain (108). The compactor (110) is configured to compress the response vectors and provide the corresponding compressed one or more response vectors to the tester (102) through the output path (120). The de-compressor (106) and compactor (110) may be implemented using various approaches based on combinational and/or sequential logic circuits. The integrated circuit (104) is devoid of the de-compressor (106) and the compactor (110), and the tester (102) is configured to directly drive the scan chain (108). The integrated circuit (104) may contain various additional elements, such as, for example, combinatorial logic elements and corresponding circuitry (e.g., a test controller) in order to internally generate various clock and control signals that may be used during coordinating of the operations involved during the scan test.

The clock signals may be generated based on the clock signal received from the tester (102). It is noted that paths (112) and (120) may contain/represent multiple signal lines (e.g., with each signal line of the multiple signal lines transferring a single bit at a time), and, accordingly, integrated circuit (104) may contain a corresponding number of pins to connect to or coupled with the multiple signal lines. In an exemplary scenario, one or more test patterns are applied to the integrated circuit (104) from the tester (102) through a set of pins that may be implemented to subject the integrated circuit (104) to the scan test. The set of pins include a scan data input pin, a scan data output pin, and a clock signal pin. The set of pins may be used to generate and transmit the control signals that may be used during coordinating of the operations involved during the scan test. Various control signals generated during the scan test are depicted in FIG. 1B.

Figure 1B:
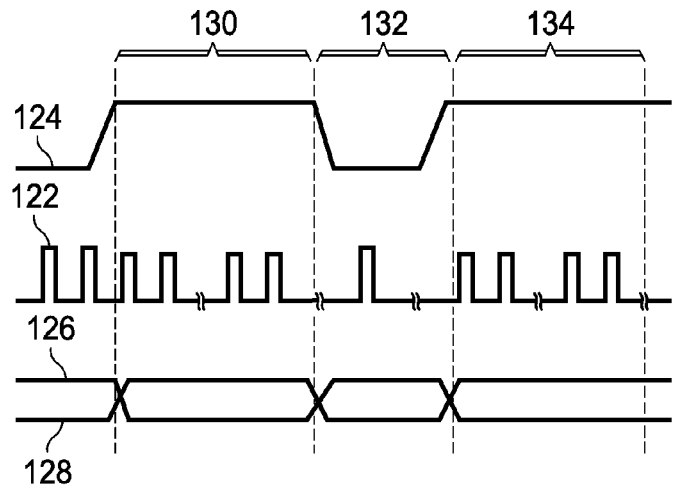
FIG. 1B illustrates exemplary waveforms of a clock signal, a test mode control signal, a scan data input signal and a scan data output signal according to an embodiment.

FIG. 1B illustrates exemplary waveforms of a clock signal (122), a test mode control signal (124), a scan data input signal (126) and a scan data output signal (128) according to an embodiment. The scan data input signal (126) and the scan data output signal (128) are simultaneously implemented to ensure that a new test pattern is shifted into the scan chain (108) at the same time as the scan data output signal (128) corresponding to a previous test pattern is shifted out of the scan chain (108). It is noted that the term "test mode control signal" is construed as referring to a signal generated internally through the integrated circuit of the present technology for controlling the shift and capture phases of a test pattern during a scan test and/or for configuring various internal registers for control of clocks and/or for control of inputs and outputs of a scan chain, for selective operation of the scan chain. Examples of the test mode control signal (124) may include, but is not limited to, a scan enable signal for controlling the shift and capture phases of a test pattern during a scan test and a load enable signal for configuring various internal registers for control of clocks to each scan chain and/or for control of inputs and outputs of each scan chain, for selective operation of the scan chain (108) for improving controllability and enabling observation. The scan enable signal has a fixed behaviour for every test pattern during the shift and the capture phases and the load enable signal enables loading of the internal registers for various controls during application of one or more test patterns to the scan chain (108) during the scan test and is operated for a fixed number of cycles for one or more test patterns as part of a shift operation. The test mode control signal (124) provides a distinction between the shift phase (e.g., shift phases (130) and (134) during which the test mode control signal (124) is asserted) and the capture phase (e.g., (132) during which the test mode control signal (124) is de-asserted) in an integrated circuit (e.g., integrated circuit (104)) and also helps to control the application of the asserted test mode control signal or the de-asserted test mode control signal to the scan chain (108).

During the shift phase (e.g., shift phases (130) and (134)) the test patterns are loaded into the scan chain (108) and the test responses are unloaded from the scan chain (108). One or more response vectors generated through the scan chain (108) in response to the test patterns loaded during the shift phase are captured during the capture phase (e.g., (132)) during normal operational mode of the storage elements that constitute the scan chain (108). As depicted in FIG. 1B, for a given number of flip-flops in the scan chain and a given test pattern, the test mode control signal (124) on being scan enable signal has a fixed relation to the number of clock cycles of the clock signal (122). Although the waveform depicted in FIG. 1B indicates one capture clock (e.g. in the capture phase (132)), a plurality of capture clocks may be involved for various types of test patterns, for example, a stuck-at fault ATPG pattern may include one capture clock, a transition fault ATPG patterns may include two capture clocks, and sequential ATPG patterns may include multiple capture clocks. The test mode control signal (124) may also change state (i.e. may be de-asserted), for example, before two capture clocks for launch-off capture transition fault ATPG patterns, in between a first capture clock and a second capture clock and in various other ways between consecutive capture clocks for various types of test patterns.

Figure 2:
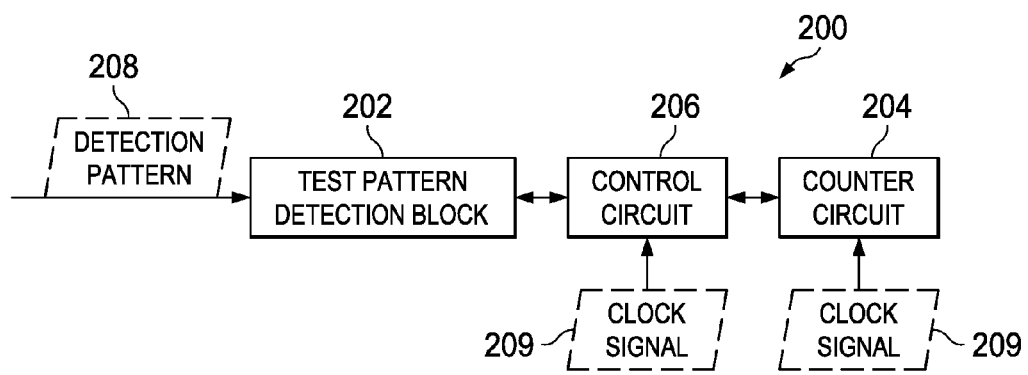
FIG. 2 depicts a first exemplary integrated circuit capable of generating a test mode control signal for a scan test through a scan chain in the integrated circuit according to an embodiment.

FIG. 2 depicts a first exemplary integrated circuit (200) capable of generating a test mode control signal for a scan test through a scan chain in the integrated circuit (200) according to an embodiment. The integrated circuit (200) includes a test pattern detection block (202), a counter circuit (204), and a control circuit (206). The test pattern detection block (202) is configured to receive a detection pattern (208). The control circuit (206) and the counter circuit (204) operate through a clock signal (209). The clock signal (209) (e.g., clock signal (122) of FIG. 1B) is received from a tester (e.g., tester (102) of FIG. 1A) during the shift and capture phases. The clock signal (209) is internally generated using, for example, a phase locked loop (e.g., in the integrated circuit (200) or otherwise in a device that is communicably coupled with the integrated circuit (200)) during the capture phase. The detection pattern (208) includes information indicative of start of a shift phase of the test pattern and/or start of a capture phase of the test pattern. For example, a pattern 8'hAA may indicate the start of a shift phase and a pattern 8'h55 may indicate the start of a capture phase. The test pattern detection block (202) is configured to detect a first pattern (e.g., 8'hAA) corresponding to the start of the shift phase of the test pattern and a second pattern (e.g., 8'h55) corresponding to the start of the capture phase of the test pattern, based on the detection pattern (208). The test pattern includes a test vector and information indicating a number of clock cycles of the clock signal (209) corresponding to each shift phase and each capture phase during the scan test. The test pattern detection block (202) detects the first pattern and the second pattern based on a bit combination at the scan data input pin of the integrated circuit (200).

The test pattern detection block (202) may utilize a single detection pattern to detect the start of the shift phases and the start of the capture phases for an entire test pattern set. The test pattern (208) may be transmitted to the test pattern detection block (202) through a variable number of input channels. For example, a pattern AA may be transmitted as 01010101 through, for example, an eight bit bus in one cycle, a four bit bus in two cycles (e.g., as or 0101 in one cycle and 0101 in a subsequent cycle), a two bit bus in four cycles (e.g., as 01 in each of the four cycles), and one bit input in eight cycles.

In an embodiment, one or more of the test pattern detection block (202), the counter circuit (204) and the control circuit (206) may be embodied as an application specific integrated circuit (ASIC) or a field programmable gate array (FPGA) specifically configured to perform a number of the operations, or a combination thereof, as described herein. In an embodiment, one or more of the test pattern detection block (202), the counter circuit (204) and the control circuit (206) may also include memory devices (e.g., a cache), timing devices (e.g., a real-time clock (RTC)), an array of configurable logic blocks (CLBs), an array of programmable input/output blocks (IOBs) and/or additional circuitry or data transmission channels. The CLBs and IOBs may be interconnected or coupled with one another by a programmable interconnect structure.

In an embodiment, one or more of the test pattern detection block (202), the counter circuit (204) and the control circuit (206) may be programmed by loading a stream of configuration data (e.g., a bit-stream) into internal configuration memory cells associated with the memory devices, wherein this configuration data may include definitions of various configurations. The configuration data may also be read from an external memory (e.g., a programmable read only memory (PROM)) or written into the integrated circuit (200) by an external device. The collective states of the individual memory cells then determine the function of the FPGA. An exemplary circuit implementation of the integrated circuit (200) of FIG. 2 is depicted in FIG. 3A.

Figure 3A:
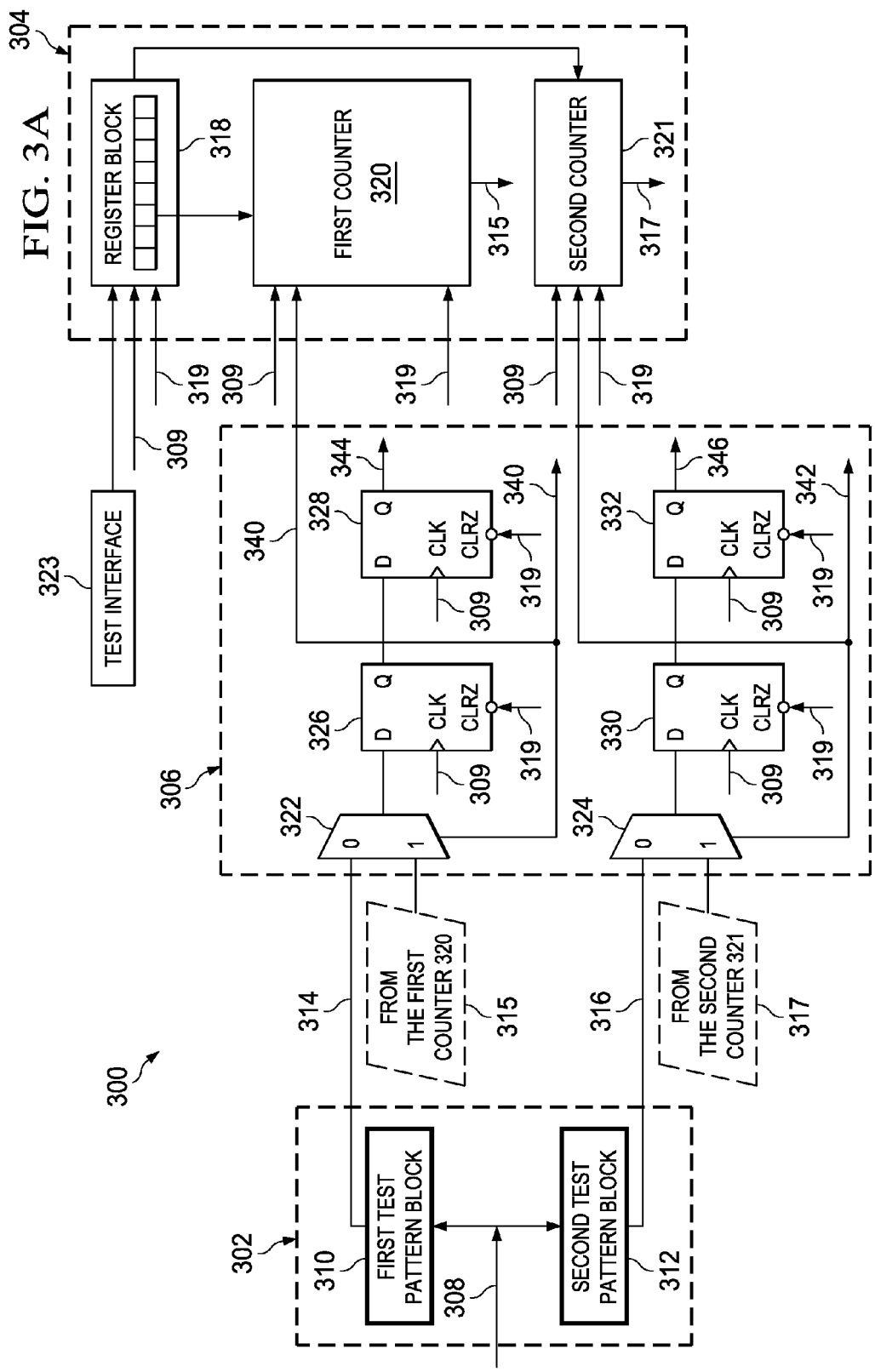
FIG. 3A depicts a first exemplary integrated circuit capable of generating a test mode control signal for a scan test through a scan chain in the integrated circuit according to an embodiment.

FIG. 3A depicts a first exemplary integrated circuit (300) capable of generating a test mode control signal for a scan test through a scan chain in the integrated circuit (300), according to an embodiment. Examples of the test mode control signal include, but are not limited to a scan enable signal, and a load enable signal. The integrated circuit (300) includes a test pattern detection block (302), a counter circuit (304), and a control circuit (306). The test pattern detection block (302), the counter circuit (304), and the control circuit (306) are substantially similar to the test pattern detection block (202), the counter circuit (204), and the control circuit (206), respectively, of FIG. 2. The test pattern detection block (302) is configured to receive a detection pattern (308). The detection pattern (308) includes information indicative of start of a shift phase of a test pattern and/or start of a capture phase of the test pattern. The test pattern may include a test vector and information indicating a number of clock cycles of a clock signal (309) corresponding to one or more shift phases and one or more capture phases during the scan test or information indicating a number of clock cycles of the clock signal (309) corresponding to one or more shift phases during the scan test.

Upon the test pattern being indicative of number of clock cycles of a clock signal (309) corresponding to one or more shift phases and one or more capture phases, the shift and capture phases are distinguished through the scan enable signal. Upon the test pattern being indicative of one or more shift phases alone, the shift phases are identified through the load enable signal. The test pattern indicative of the one or more capture phases and shift phases and the test pattern indicative of one or more shift phases alone are selected in a preferred order, using a matching test mode control. The clock signal (309) (e.g., clock signal (122) of FIG. 1B) is received from a tester (e.g., (102) of FIG. 1A) during the shift and capture phases. The clock signal (309) may be an internally generated using, for example, a phase locked loop (e.g., in the integrated circuit (300) or otherwise in a device that is communicably coupled with the integrated circuit (300)) during the capture phase. The test pattern detection block (302) is also configured to detect a first pattern corresponding to a start of a shift phase (e.g., 8'hAA) of a test pattern and a second pattern (e.g., 8'h55) corresponding to a start of a capture phase of the test pattern, based on the detection pattern (308).

The test pattern detection block (302) detects the first pattern and the second pattern based on a bit combination at the scan data input pin. The test pattern detection block (302) includes a first test pattern block (310) configured to detect the first pattern corresponding to the shift phase of the test pattern and a second test pattern block (312) configured to detect the second pattern corresponding to the capture phase of the test pattern. The test pattern detection block (302) is configured to generate a trigger signal (e.g., (314) and (316)) based upon the detection of the first pattern and the second pattern. The first test pattern block (310) detects the first pattern, such as, for example, 8'hAA, which is indicative of a start of a shift phase and generates the trigger signal (314), and the second test pattern block (312) detects the second pattern, such as, for example, 8'h55, which is indicative of a start of a capture phase and generates the trigger signal (316).

The trigger signal (e.g., (314) and (316)) is transmitted to the control circuit (306) that in turn triggers the counter circuit (304) through the control circuit (306). The counter circuit (304) is configured to generate one or more count states based on the detected pattern. The counter circuit (304) generates one or more count states corresponding to the shift phase and the clock signal (309) and one or more count states corresponding to the capture phase and the clock signal (309). The counter circuit (304) includes a register block (318), a first counter (320), and a second counter (321). The register block (318) includes one or more registers configured to operate through the clock signal (309) and a reset signal (319). The register block (318) is configured to store at least one of a shift start count state, a capture start count state, a shift end count state, and a capture end count state.

The duration between the shift start count state and the shift end count state corresponds to a duration for which the test mode control signal remains asserted for the shift phase and also corresponds to number of cycles of the clock signal (309) for which a shift operation must be performed during the scan test. The duration may correspond to a maximum length of the scan chain in terms of duration. The duration between the capture start count state and the capture end count state corresponds to a duration for which the test mode control signal remains de-asserted for the capture phase also corresponds to number of cycles of the clock signal (309) for which a capture operation must be performed during the scan test. The integrated circuit (300) also includes a test interface ((323)) communicatively associated or coupled with the register block (318) and configured to control the register block (318) and change at least one of the shift start count state, the capture start count state, the shift end count state, and the capture end count state based on the test pattern. Examples of the test interface ((323)) include, but are not limited to joint test action group (JTAG) interface and an embedded core test interface. The first counter (320) and the second counter (321) are coupled with the register block (318). The clock signal (309) from the tester is used for the first counter (320) and the second counter (321) for shift and capture operations. Alternatively, The clock signal (309) from the tester is used to clock the first counter (320) for a shift operation, and a high speed internally generated clock signal (e.g., generated using a phase locked loop) is used to clock the second counter (321) for the capture operation.

The first counter (320) is configured to generate the one or more count states corresponding to the shift phase from the shift start count state to the shift end count state (e.g., zero count). The second counter (321) is configured to generate the one or more count states corresponding to the capture phase from the capture start count state to the capture end count state (e.g., zero count). The first counter (320) and the second counter (321) may include down counters. The down counters may include, but are not limited to, eight bit down counters. The control circuit (306) is coupled with the test pattern detection block (302) so as to be positioned to receive one or more trigger signals (e.g., (314) and (316)) from the test pattern detection block (302). The control circuit (306) is coupled with the counter circuit (304) such that one or more count states including the shift end count state or the capture end count state are fed into the control circuit (306) so as to trigger the control circuit (306). The control circuit (306) includes one or more selection blocks (e.g., selection blocks (322) and (324)) and one or more flip-flops (e.g., D flip-flops (326), (328), (330), and (332)).

Examples of the selection blocks include, but are not limited to, multiplexers. Each of the one or more selection blocks (e.g., (322) and (324)) are configured to receive a trigger signal (e.g., (314) and (316)) from the test pattern detection block (302) and signals (((315)) and ((317))) corresponding to the one or more count states from the counter circuit (304). In an embodiment, a first selection block (322) is configured to receive a signal ((315)) corresponding to the shift end count state of the first counter (320) and is de-activated upon or subsequent to receiving the signal ((315)), and a second selection block (324) is configured to receive a signal ((317)) corresponding to the capture end count state of the second counter (321) and is de-activated upon or subsequent to receiving the signal ((317)).

In an embodiment, each of the flip-flops (e.g., flip-flops (326), (328), (330), and (332)) operates through the clock signal (309) and the reset signal (319). Upon or subsequent to receiving the trigger signal (e.g., trigger signals (314) and (316)), each of the selection blocks (e.g., selection blocks (322) and (324)) triggers the one or more flip-flops (e.g., flip flops (326), (328), (330), and (332)) to generate one or more count enable signals (e.g., signals (340) and (342)) so as to trigger the generation of one or more count states through the counter circuit (304). The control circuit (306) is configured to generate and control the test mode control signal based on the one or more count states corresponding to the shift phase and the one or more count states corresponding to the capture phase. The control circuit (306) is configured to perform assertion of the test mode control signal if the count state is one of the shift start count state and the capture end count state.

The control circuit (306) is configured to generate an enable sync signal (344) based upon which an asserted test mode control signal is generated through a scan enable generation logic. The control circuit (306) is also configured to perform de-assertion of the test mode control signal if the count state is one of the capture start count state and the shift end count state. The control circuit (306) is configured to generate an enable sync capture signal (346) based upon which a de-asserted test mode control signal is generated through the scan enable generation logic.

Figure 3B:
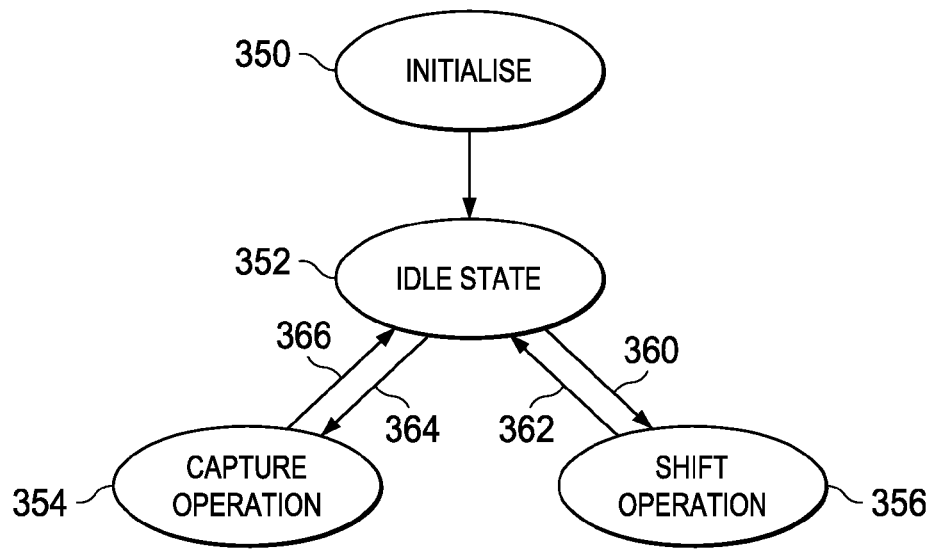
FIG. 3B is an exemplary representation of a process flow illustrating an operation of the integrated circuit of FIG. 3A according to an embodiment.

FIG. 3B is an exemplary representation of a process flow illustrating an operation of the integrated circuit (300) of FIG. 3A according to an embodiment. In FIG. 3B, the plurality of states of a scan test of the integrated circuit (300) is represented by blocks (350)-(356). The plurality of states of an operation include, but are not limited to, an initialize state (350), an idle state (352), a shift operation (354), and a capture operation (356). In an embodiment, during the initialize state (350), the operation (or scan test) of the integrated circuit (300) is initialized. During the idle state (352), one or more wait cycles occur in the scan test before a start of a shift phase or a capture phase. Upon or subsequent to detection (see, e.g., (360)) of a first pattern corresponding to a shift phase of the test pattern (308) by the test pattern detection block (302), the shift operation begins (see, e.g., (356)). During shift operation (356), the control circuit (306) is configured to generate the count enable signal (340) to trigger the counter circuit (304) and is also configured to generate the enable sync signal (344) and the asserted test mode control signal based on the enable sync signal (344). As the counter circuit (304) is triggered, the counter circuit (304) generates one or more count states corresponding to the shift phase. It is noted that the test mode control signal remains asserted for the duration of the one or more count states generated through the counter circuit (304). The first counter (320) is triggered upon or subsequent to detection of the pattern corresponding to the shift phase of the test pattern (308) and the first counter (320) begins to generate one or more count states (for example, starts decrementing from the shift start count state to the shift end count state at each clock cycle).

The first counter (320) changes a count state (for example, by down counting from the shift start count state) until the count state of the first counter (320) reaches the shift end count state (e.g., zero count). Upon or subsequent to the count state of the first counter (320) reaching the shift end count state, the shift operation (356) ends (shown as (362)), and the scan testing of the integrated circuit (300) resumes the idle state (352). Upon or subsequent to detection (shown as (364)) of a second pattern corresponding to a capture phase of the test pattern by the test pattern detection block (302), at (354) the capture operation begins, and the control circuit (306) generates the count enable signal (342) to trigger the counter circuit (304) and the also generates the enable sync capture signal (346), and the de-asserted test mode control signal is generated based on the enable sync capture signal (346). Upon or subsequent to being triggered, the counter circuit (304) generates count states corresponding to the capture phase. The test mode control signal remains de-asserted for the duration of the one or more count states corresponding to the capture phase. The second counter (321) is triggered by count enable signal (342) and, upon or subsequent to triggering the second counter (321), generates one or more count states (for example, decrementing the count state from the capture start count state to the capture end count state at each clock cycle).

The second counter (321) changes its count state (for example, by down counting from the capture start count state) until the count state of the second counter (321) reaches a capture end count state (e.g., zero count). Upon or subsequent to reaching the capture end count state, the capture operation (354) ends (shown as (366)) and the integrated circuit (300) resumes to the idle state (352). In some embodiments, the counter circuit (304) may include a single counter for performing individual or combined functionalities of the first counter (320) and the second counter (321) described herein with reference to FIG. 3A.

In some embodiments, the integrated circuit of the present technology may include one or more wait counters configured to generate one or more wait cycles prior to the shift and capture phases so as to enable a passage of a specific number of cycles, for example, for the scan enable signal generation logic to stabilise before a subsequent shift phase begins and for an internal clock controller logic to initialise and attain a state where the internally generated at-speed capture pulses are available before a subsequent capture phase begins. Also, some test patterns may implement a different number of at-speed capture pulses; for example, test patterns such as stuck-at fault patterns may implement one at-speed capture pulse, and test patterns such as standard transition delay fault and path delay fault patterns may implement two at-speed capture pulses. Some test patterns of the latter category have "sequential depth" of greater than two, where more than two at-speed capture pulses are required. The integrated circuit of the present technology is enabled to provide a variable number of at-speed capture pulses. In an embodiment, an integrated circuit includes one or more wait counters configured to provide a fixed number of at-speed capture pulses. In one or more embodiments, a test pattern detection block may replace the wait counters to provide a variable number of at-speed capture pulses based on a pattern detect value. An exemplary integrated circuit including a wait counter is described in FIGS. 4A-4B.

FIG. 4A depicts a second exemplary integrated circuit (400) capable of generating a test: mode control signal for a scan test through a scan chain in the integrated circuit (400) according to an embodiment. The integrated circuit (400) includes a test pattern detection block (402), a counter circuit (404), and a control circuit (406). The test pattern detection block (402) is configured to receive a detection pattern (408). The detection pattern (408) is substantially similar to the detection pattern (308) of FIG. 3A. The clock signal (410) (e.g., of FIG. 1B) is received from a tester (e.g., tester (102) of FIG. 1A). The clock signal (410) may be internally generated in the integrated circuit (300) using, for example, a phase locked loop (e.g., in the integrated circuit (400) or otherwise in a device that is communicably coupled with the integrated circuit (400)), and the like. The test pattern detection block (402) is configured to detect a pattern (e.g., 8'hAA) corresponding to a start of a shift phase of a test pattern. The test pattern is substantially similar to the test pattern described herein with reference to FIG. 3A. The test pattern detection block (402) detects the pattern based on a bit combination at the scan data input pin.

The test pattern detection block (402) is configured to generate a trigger signal (e.g., (412)) based upon the detection of the pattern. The trigger signal (412) is transmitted to the control circuit (406) so as to in turn trigger the counter circuit (404) through the control circuit (406). The counter circuit (404) is configured to generate one or more count states based on the detected shift pattern. In one embodiment, the counter circuit (404) generates one or more count states corresponding to the shift phase and the clock signal (410) and one or more count states corresponding to the capture phase and the clock signal (410) to prepare for a test pattern whose control is provided through the scan enable signal. In another embodiment, the counter circuit (404) generates one or more count states corresponding to the shift phase and the clock signal (410) to prepare for a test pattern whose control is provided through the load enable signal. The counter circuit (404) includes a register block (414), a first counter (416), a second counter 418, and a wait counter (420). For purposes of illustration, the detailed description refers to a wait counter; it is noted, however, that the scope of the methods and integrated circuits disclosed herein is not limited to the implementation of a wait counter and may be extended to include a combination of more than one wait counter.

The register block (414) includes one or more registers that operate through the clock signal (410) and a reset signal (419). Also, each of the first counter (416), the second counter 418, and the wait counter (420) operates through the clock signal (410) and the reset signal (419). The register block (414) is configured to store at least one of a shift start count state, a capture start count state, a shift end count state, a capture end count state, and a predetermined count state value indicative of a number wait cycles. The duration between the shift start count state and the shift end count state corresponds to a duration for which the test mode control signal remains asserted for the shift phase, and the duration between the capture start counter state and the capture end count state corresponds a duration for which the test mode control signal remains de-asserted for the capture phase. The shift start count state may correspond to a maximum length of the scan chain in terms of duration. The capture start count state corresponds to a duration for which the test mode control signal remains de-asserted for the capture phase. The integrated circuit (400) also includes a test interface (421) communicatively associated or coupled with the register block (414) so as to be positioned to control the register block (414) and change at least one of the shift start count state, the capture start count state, the shift end count state, and the capture end count state based on the test pattern. Examples of the test interface (421) include, but are not limited to, a JTAG interface and an embedded core test interface.

The first counter (416) and the second counter 418 are coupled with the register block (414). The clock signal (410) from a tester (e.g., tester (102) of FIG. 1A) is used to clock the first counter (416) and the second counter 418 for shift and capture operations, respectively. Alternatively, in an embodiment, clock signal (410) from the tester is used to clock the first counter (416) for a shift operation, and a high speed internally generated clock signal (e.g., generated using a phase locked loop) is used to clock the second counter 418 for the capture operation.

The first counter (416) is configured to generate the one or more count states corresponding to the shift phase from the shift start count state to the shift end count state (e.g., zero count). The first counter (416) generates the one or more count states upon or subsequent to the detection of the pattern corresponding to a start of a shift phase based on the detection pattern (408). The second counter 418 is configured to generate the one or more count states corresponding to the capture phase from the capture start count state to the capture end count state (e.g., zero count). The first counter (416) and the second counter 418 may include down counters. The down counters may include, but are not limited to, eight bit down counters. The first counter (416) is coupled with the wait counter (420) such that the wait counter (420) is triggered by a signal corresponding to the shift end count state (see, e.g., signal (413)) of the first counter (416) to generate count states corresponding to one or more wait cycles before a capture phase. The wait counter (420) is coupled to the register block (414) to retrieve the predetermined count state value from the register block (414), the predetermined count state value being indicative of a number of wait cycles to be generated upon actuation of the wait counter (420). The information indicative of the number of the wait cycles is included in the detection pattern. In such embodiment, the detection pattern may include a first set of patterns indicative of the number of wait cycles and a second set of patterns indicative of a start of the capture phase. Upon or subsequent to the completion of the one or more wait cycles, the wait counter (420) triggers the control circuit (406) (see, e.g., signal (415)) to in turn trigger the second counter 418 to generate one or more count states corresponding to the capture phase. The second counter 418 generates one or more counter states from the capture start count state to a capture end count state (e.g., zero count).

The control circuit (406) is coupled with the test pattern detection block (402) so as to be positioned to receive a trigger signal (e.g., (412)) from the test pattern detection block (402) upon or subsequent to a detection of the pattern (e.g., 8'hAA) corresponding to a start of the shift phase. The control circuit (406) includes one or more selection blocks (e.g., selection blocks (422), (424), and (425)) and one or more flip-flops (e.g., D flip-flops (426), (428), (430), and (432)). Examples of the selection blocks (e.g., selection blocks (422), (424), and (425)) may include, but are not limited to, multiplexers. The selection block (422) is configured to receive the trigger signal (412) from the test pattern detection block (402) and a signal (413) corresponding to the one or more count states of the first counter (416).

Each of the flip-flops (e.g., flip flops (426), (428), (430), and (432)) operates through the clock signal (410) and the reset signal (419). Upon or subsequent to receiving the trigger signal (412), a first selection block (422) triggers the flip-flops (426) and (428). Upon or subsequent to being triggered, the flip-flops (426) and (428) operate in concert to generate an enable signal (436) that triggers the first counter (416) to generate one or more count states corresponding to a shift phase and an enable sync signal (438) that may be used to generate an asserted test mode control signal through a test mode control signal generation logic. Upon or subsequent to receiving the shift end count state (see, e.g., (413)), at the selection block (422), the flip flops (e.g., flip flops (426), (428), (430), and (432)) are de-activated, the enable sync signal (438) attains a low level, and, consequently, the test mode control signal is de-asserted. A second selection block (424) receives the enable sync signal (438) and a signal (415) corresponding to one or more count states of the wait counter (420). Upon or subsequent to the enable sync signal (438) attaining a low level (such as when the enable sync signal (438) transitions, for example, from logic 1 to logic 0) indicative of an end of the shift phase, the second selection block (424) triggers the flip-flop (430) to generate a count enable signal (442) that triggers the second counter 418 so as to generate one or more count states.

Upon or subsequent to being triggered, the second counter 418 generates one or more count states starting from the capture start count state to the capture end count state (for example, decrementing the count state from the capture start count state to the capture end count state at each clock cycle). Also a third selection block (425) receives the enable signal (442) and a signal corresponding to one or more count states (see, e.g., (417)) of the second counter 418. Upon or subsequent to receiving the enable signal (442) and the signal (417) corresponding to one or more count states from the second counter 418, the third selection block (425) triggers the flip flop (432) to generate an enable sync capture signal (444) that is used to generate a de-asserted test mode control signal through the test mode control signal generation logic. Upon or subsequent to receiving the signal (417) corresponding to the capture end count state, the third selection block (425) de-activates the flip-flop (432), and, consequently, the enable sync capture signal (444) attains a low level that leads to de-assertion of the test mode control signal.

Figure 4B:
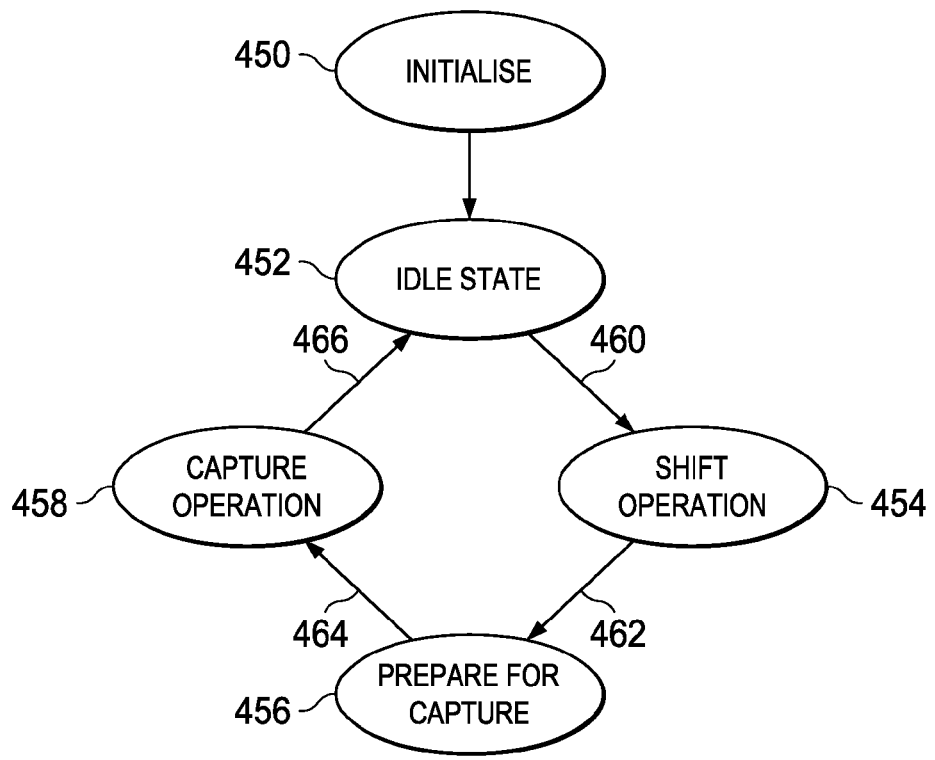
FIG. 4B is an exemplary representation of a process flow illustrating an operation of the integrated circuit of FIG. 4A according to an embodiment.

FIG. 4B is an exemplary representation of a process flow illustrating an operation of the integrated circuit (400) of FIG. 4A according to an embodiment. In FIG. 4B, the plurality of states of a scan test of integrated circuit (400) are represented by blocks (450)-(458). The plurality of states include, but are not limited to, an initialize state (450), an idle state (452), a shift operation (454), a prepare for capture operation (456), and a capture operation (456). In an embodiment, during the initialize state (450), the scan test of the integrated circuit (400) is initialized by receiving a clock signal (410) from a tester (e.g., tester(102) of FIG. 1A). During the idle state (452), there is one or more wait cycles in the scan test before a start of a shift phase or a capture phase. Upon or subsequent to detection (see, e.g., (460)) of a pattern corresponding to a shift phase of the test pattern by the test pattern detection block (402), the shift operation begins (see, e.g., (454)). During the shift operation (454), the counter circuit (404) begins to generate count states corresponding to the shift phase.

The control circuit (406) generates the count enable signal (436) so as to trigger the counter circuit (404), and the control circuit (406) also generates the enable sync signal (438) and the asserted test mode control signal based on the enable sync signal (438). The first counter (416) is triggered upon or subsequent to detection of the pattern corresponding to the shift phase of the test pattern and as the first counter (416) is triggered, the first counter (416) retrieves the shift start count state from the register block (414) and generates one or more count states corresponding to the shift phase (for example, first counter (416) decrements the count state from the shift start count state to the shift end count state at each clock cycle). The one or more count states are generated starting from the shift start count state. It is noted that the test mode control signal remains asserted for the duration of the one or more count states generated through the first counter (416).

The first counter (416) changes its count state (for example, by down counting from the shift start count state) until the count state of the first counter (416) reaches the shift end count state (e.g., zero count). Upon or subsequent to the count state of the first counter (416) reaching the shift end count state (see, e.g., signal (413) in FIG. 4A), the shift operation (454) ends (shown as (462)), the test mode control signal is de-asserted, and the integrated circuit (400) performs the prepare capture operation (shown as (456)). During the prepare for capture operation (456), the wait counter (420) is triggered. Upon or subsequent to being triggered, the wait counter (420) generates one or more count states corresponding to one or more wait cycles. Upon or subsequent to completion of the one or more wait cycles (see, e.g., signal (415) in FIG. 4A), the second counter 418 is triggered, and the capture operation (shown as (458)) begins at (466).

During the capture operation (458), the second counter 418 retrieves the capture start count state from the register block (414) and generates one or more count states corresponding to the capture phase (for example, by decrementing the count state from the capture start count state to the capture end count state at each clock cycle). The control circuit (406) generates the count enable signal (442) so as to trigger the counter circuit (404), and also generates the enable sync capture signal (444) and the de-asserted test mode control signal based on the enable sync capture signal (444). The second counter 418 changes the count state (e.g., by down counting from the capture start count state) until the count state of the second counter 418 reaches the capture end count state. Upon or subsequent to the count state of the second counter 418 reaching the capture end count state, the capture operation ends (shown as 466) and the integrated circuit (400) resumes to the idle state (452). The integrated circuit of the present technology may be configured to operate based on detection of a pattern corresponding to a first shift phase and for subsequent shift and capture phases the integrated circuit may operate iteratively based on the count states generated through various counters, and such an integrated circuit is described further in FIGS. 5A to 6.

Figure 5A:
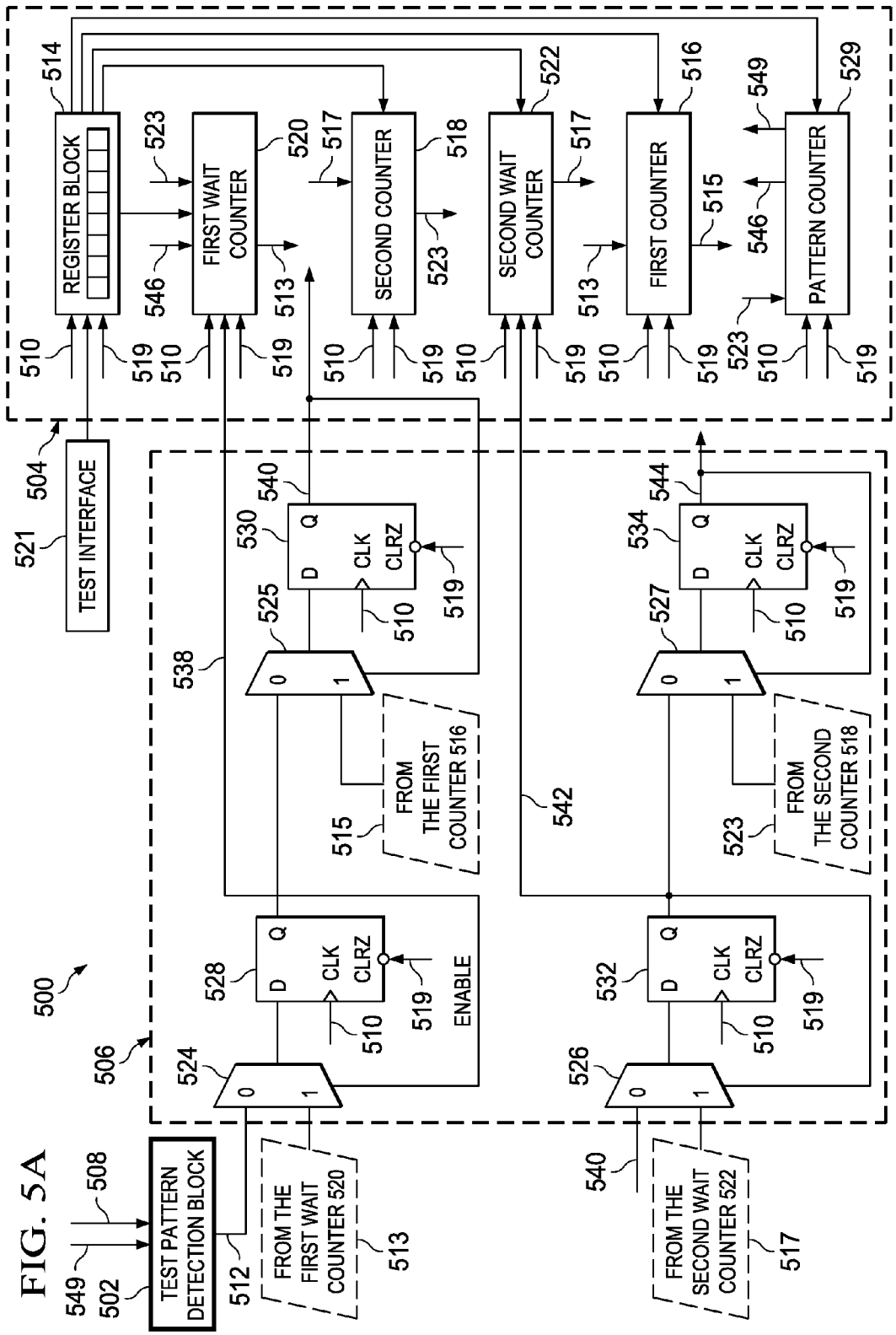
FIG. 5A depicts a third exemplary integrated circuit capable of generating a test mode control signal for a scan test through a scan chain in the integrated circuit according to an embodiment.

FIG. 5A depicts a third exemplary integrated circuit (500) capable of generating a test mode control signal for a scan test through a scan chain in the integrated circuit (500) according to an embodiment. The integrated circuit (500) includes a test pattern detection block (502), a counter circuit (504), and a control circuit (506). The test pattern detection block (502) is configured to receive a detection pattern (508). The detection pattern (508) is substantially similar to the detection pattern (308) of FIG. 3A. The clock signal (510) (e.g., clock signal (122) of FIG. 1B) is received from a tester (e.g., tester (102) of FIG. 1A). The clock signal (510) may be internally generated using, for example, a phase locked loop (e.g., in the integrated circuit (500) or otherwise in a device that is communicably coupled with the integrated circuit (500)) during the capture phase. The test pattern detection block (502) is configured to detect a pattern (e.g., 8'hAA) corresponding to a start of a first shift phase of a test pattern. The test pattern is substantially similar to the test pattern described herein with reference to FIG. 3A. The test pattern detection block (502) detects the pattern based on a bit combination at a scan data input pin.

The detection of the pattern by the test pattern detection block (502) triggers control circuit (506) which in turn triggers the counter circuit (504). The counter circuit (504) is configured to generate one or more count states upon or subsequent to being triggered. The counter circuit (504) is configured to generate one or more count states corresponding to the shift phase and the clock signal (510) and one or more count states corresponding to the capture phase and the clock signal (510) or an internally generated clock signal. The counter circuit (504) includes a register block (514), a first counter (516), a second counter (518), a first wait counter (520), and a second wait counter (522). In an embodiment, each of the register block (514), the first counter (516), the second counter (518), the first wait counter (520), and the second counter (522) operate through the clock signal (510) and a reset signal (519). For purposes of illustration, this detailed description refers to a wait counter; it is noted, however, that the scope of the methods and integrated circuits disclosed herein is not limited to the implementation of a wait counter, and that the scope may be extended to include a combination of more than one wait counter.

The register block (514) includes one or more registers. The register block (514) is configured to store at least one of a shift start count state, a capture start count state, a shift end count state, a capture end count state, and a predetermined count state value indicative of a number and duration of wait cycles. The duration between the shift start count state and the shift end count state corresponds to a duration for which the test mode control signal remains asserted for the shift phase. The duration may correspond to a maximum length of the scan chain in terms of duration. The duration between the capture start count state and the capture end count state corresponds to a duration for which the test mode control signal remains de-asserted for the capture phase. The integrated circuit (500) also includes a test interface (521) communicatively associated or coupled with the register block (514) and configured to control the register block (514) and change at least one of the shift start count state, the capture start count state, the shift end count state, and the capture end count state based on the test pattern. Examples of the test interface (521) include, but are not limited to, a JTAG interface and an embedded core test interface.

The first counter (516) and the second counter (518) are coupled with the register block (514) so as to retrieve the shift start count state and the capture start count state, respectively, from therein. The clock signal (510) from the tester is used for the first counter (516) and the second counter (518) for shift and capture operations. Alternatively, in an embodiment, clock signal (510) from the tester is used to clock the first counter (516) for a shift operation, and a high speed internally generated clock signal (e.g., generated using a phase locked loop) is used to clock the second counter (518) for the capture operation.

The first counter (516) is configured to generate the one or more count states corresponding to the shift phase from the shift start count state to the shift end count state (e.g., zero count). The first counter (516) generates the one or more count states upon or subsequent to a detection of the pattern corresponding to a start of a first shift phase of the test pattern and upon or subsequent to an end of a capture phase of the test pattern. The second counter (518) is configured to generate the one or more count states corresponding to one or more capture phases of the test pattern. The second counter (518) is configured to generate one or more count states from the capture start count state to the capture end count state (e.g., zero count). The first counter (516) and the second counter (518) may include down counters. The down counters may include, but are not limited to, eight bit down counters.

The first wait counter (520) is configured to generate one or more count states corresponding to one or more wait cycles before the start of the shift phase. The second wait counter (522) is configured to generate one or more count states corresponding to one or more wait cycles before the start of the capture phase. The first wait counter (520) and the second wait counter (522) are coupled with the register block (514) and are configured to retrieve the predetermined count state value indicative of a number and duration of wait cycles from the register block (514) upon, prior or subsequent to being triggered. The register block (514) may store different count state values for the first wait counter (520) and the second wait counter (522). The integrated circuit (500) additionally includes a pattern counter 529 configured to generate one or more count states corresponding to a predetermined number of transitions from the shift start count state corresponding to the shift phase of the test pattern to the capture end count state corresponding to the capture phase of the test pattern. The predetermined number of transitions is indicative of a predetermined number of test patterns applied to the scan chains during the scan test. The pattern counter 529, counts the number of test patterns applied to the scan chains. Each test pattern may include a shift phase and a capture phase. The register block (514) stores an initial count state of the pattern counter 529 indicative of a maximum number of test patterns applicable during the scan test through the scan chain. The pattern counter 529 retrieves the initial count state from the register block (514) and generates the one or more count states starting from the initial count state.

The first wait counter (520) is coupled with the control circuit (506) such that the first wait counter (520) is triggered upon or subsequent to detection of a pattern corresponding to a first shift phase of the test pattern. Upon or subsequent to being triggered, the first wait counter (520) generates one or more count states corresponding to one or more wait cycles. Upon or subsequent to completion of the one or more wait cycles (see, e.g., (513)), the first wait counter (520) triggers the first counter (516) to generate one or more count states corresponding to the shift phase. Upon or subsequent to being triggered, the first counter (516) retrieves the shift start count state from the register block (514) and generates one or more count states corresponding to the shift phase, such as by starting from the shift start count state and continuing to the shift end count state (see, e.g., (515)) (e.g., zero count). The shift end count state (see, e.g., (515)) of the first counter (516) triggers the second wait counter (522) to generate one or more wait cycles prior to a capture phase.

Upon or subsequent to a completion of the one or more wait cycles (see, e.g., (517)) of the second wait counter (522), the second counter (518) is triggered. Upon or subsequent to being triggered, the second counter (518) generates one or more count states corresponding to the capture phase. The second counter (518) generates count states starting from the capture start count state and continuing to the capture end count state (e.g., zero count). The capture end count state (see, e.g., (523)) of the second counter (518) leads to a triggering of the pattern counter 529 that is initialized to the initial count value indicative of the predetermined number of allowed transitions from the shift start count state corresponding to the shift phase of the test pattern to the capture end count state corresponding to the capture phase of the test pattern. Upon or subsequent to being triggered the pattern counter (521) changes by one count state. The change in the count state may be a decrement. Upon or subsequent to the completion of the change in the count state (see, e.g. (546)) of the pattern counter 529, the first counter (516) is again triggered to generate one or more count states corresponding to a subsequent shift phase. The pattern counter 529 is configured to trigger the first counter (516) for the predetermined number of transitions from the shift start count state corresponding to the shift phase of the test pattern to the capture end count state corresponding to the capture phase of the test pattern. In an embodiment, upon or subsequent to completion of the predetermined number of transitions, the test pattern block (502) is triggered (see, e.g. (549)) so as to detect a subsequent shift phase.

The test pattern detection block (502) is coupled with the control circuit (506) and is configured to trigger the control circuit (506) upon or subsequent to a detection of the pattern corresponding to a start of a first shift phase of the test pattern that in turn triggers the counter circuit (504). The control circuit (506) includes one or more selection blocks (e.g., selection blocks (524), (525), (526), and (527)) and one or more flip-flops (e.g., D flip-flops (528), (530), (532), and (534)). The flip-flops (e.g., flip-flops (528), (530), (532), and (534)) operate through the clock signal (510) and the reset signal (519). A first selection block (524) is configured to receive the trigger signal (512) from the test pattern detection block (502) and one or more count states (see, e.g., (513)) of the first wait counter (520). Upon or subsequent to receiving the trigger signal (512), the first selection block (524) triggers the flip flop (528) to generate an enable signal (538) that triggers the first wait counter (520) to generate one or more count states corresponding to one or more wait cycles before the first shift phase. The completion of the one or more wait cycles (see, e.g., (513)) triggers the first counter (516). Upon or subsequent to being triggered, the first counter (516) generates one or more count states corresponding to the first shift phase, such as by starting from the shift start count state and continuing to the shift end count state (see, e.g., (515)).

Also, the triggering of the first counter (516) in turn triggers the second selection block (525), which triggers flip flop (530) to generate an enable sync signal (540), and an asserted test mode control signal is generated based on the enable sync signal (540) through a test mode control signal generation logic. The shift end count state (see, e.g., (515)) of the first counter (516) de-activates the second selection block (525), which in turn causes the enable sync signal (540) to attain a low state (e.g., by transitioning from logic 1 to logic 0) that leads to de-assertion of the test mode control signal. A third selection block (526) is configured to receive the enable sync signal (540) and one or more count states (see, e.g., (517)) of the second wait counter (522). The third selection block (526) is triggered upon or subsequent to a change in the enable sync signal (540) from logic 1 to logic 0. Upon or subsequent to being triggered, the third selection block (526) in turn triggers the flip flop (532) to generate an enable capture signal (542). The enable capture signal (542) triggers the second wait counter (522) to generate one or more count states corresponding to one or more wait cycles prior to the capture phase.

The completion of the one or more wait cycles (see, e.g., (517)) of the second wait counter (522) triggers the second counter (518). Upon or subsequent to being triggered, the second counter (518) generates one or more count states corresponding to the capture phase. Also, the one or more count states (see, e.g., (523)) of the second counter (518) leads to a triggering of a fourth selection block (527) so as to in turn trigger flip flop (534) to generate an enable sync capture signal (544). A de-asserted test mode control signal is generated based on the enable sync capture signal (544) through the test mode control signal generation logic. A capture end count state (see, e.g., (523)) of the second counter (518) de-activates the selection block (527) that in turn de-activates the flip flop (534) and triggers the first wait counter (520) to generate one or more wait cycles prior to a subsequent shift phase. The capture end count state triggers the pattern counter 529 that enables the integrated circuit (500) to operate in a cyclic manner for the predetermined number of transitions.

Figure 5B:
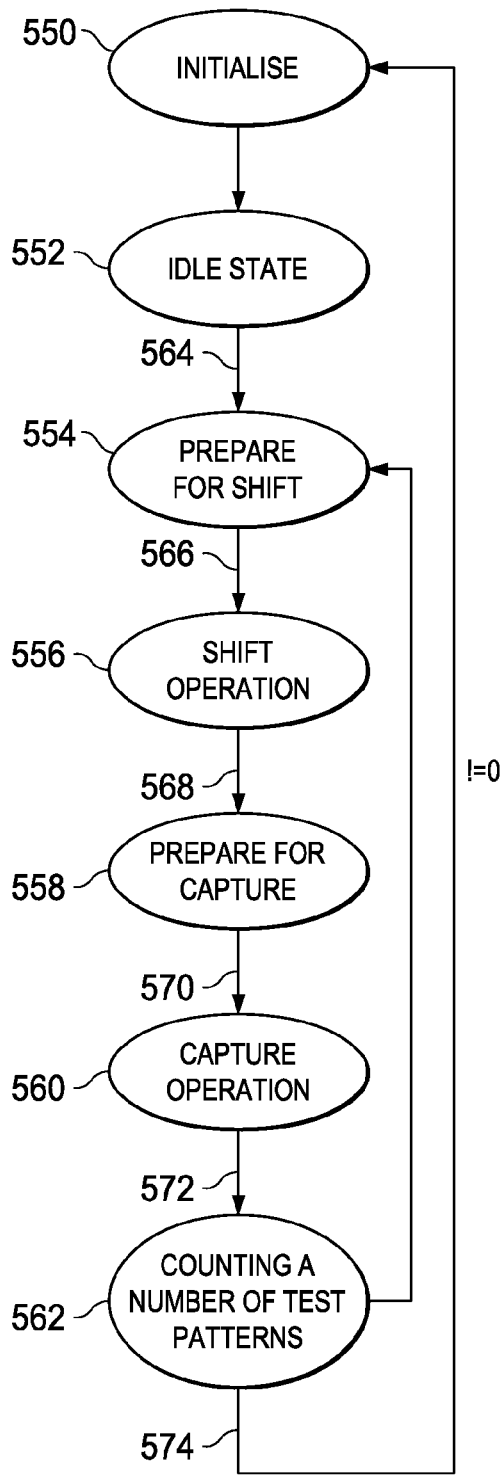
FIG. 5B is an exemplary representation of a process flow illustrating an operation of the integrated circuit of FIG. 5A according to an embodiment.

FIG. 5B is an exemplary representation of a process flow illustrating an operation of the integrated circuit (500) of FIG. 5A according to an embodiment. In FIG. 5B, the plurality of states of a scan test of the integrated circuit (500) are represented by blocks (550)-(562). The plurality of states of operation include, but are not limited to, an initialize state (550), an idle state (552), a prepare for shift operation (554), a shift operation (556), a prepare for capture operation (558), a capture operation (560), and a test pattern counting operation (562). In an embodiment, during the initialize state (550), the operation of the integrated circuit (500) is initialized by receiving the clock signal (510) from the tester (e.g., (102) of FIG. 1A). During the idle state (552), there are one or more wait cycles before detection of a first shift phase. Upon or subsequent to detection (see, e.g., (564)) of a pattern corresponding to the first shift phase of the test pattern by the test pattern detection block (502), the integrated circuit (500) prepares for a shift (see, e.g., (554)).

During the preparation for shift operation (554), the first wait counter (520) is triggered to generate one or more wait cycles. Upon or subsequent to completion of the one or more wait cycles, the shift operation begins (see, e.g., (556)). During the shift operation (556), the first counter (516) is triggered to generate one or more count states corresponding to the first shift phase (for example, to decrement the count state from the shift start count state to the shift end count state at each clock cycle), and an asserted test mode control signal is generated as explained in FIG. 5A. The test mode control signal remains asserted for the duration of the one or more count states generated through the first counter (516). Upon or subsequent to the count state of the first counter (516) reaching the shift end count state, the shift operation ends (shown as (568)). At (558), preparation for a capture operation is performed so as to prepare for a capture phase. The preparation for capture operation (558) also involves generation of one or more wait cycles through the second wait counter (522).

Upon or subsequent to completion of the one or more wait cycles, the capture operation begins (see, e.g., (570)). At (560), the capture operation is performed by triggering the second counter (518) as explained earlier herein with reference to FIG. 5A. Also, during the capture operation (see, e.g., (560)) the de-asserted test mode control signal is generated. The capture operation (560) ends (see, e.g., (574)) upon or subsequent to generating a capture end count state. Upon or subsequent to the count state of the second counter (518) reaching the capture end count state, a count state of the pattern counter 529 is changed (see, e.g., (562)) by one count state. If the pattern counter 529 does not hold a minimum count state (e.g., zero count) corresponding to the predetermined number of transitions, the operations (554), (556), (558), and (560) are performed for the predetermined number of transitions. Upon or subsequent to completion of the predetermined number of transitions (see, e.g., (574)), the process is initialised again at (550).

Figure 6:
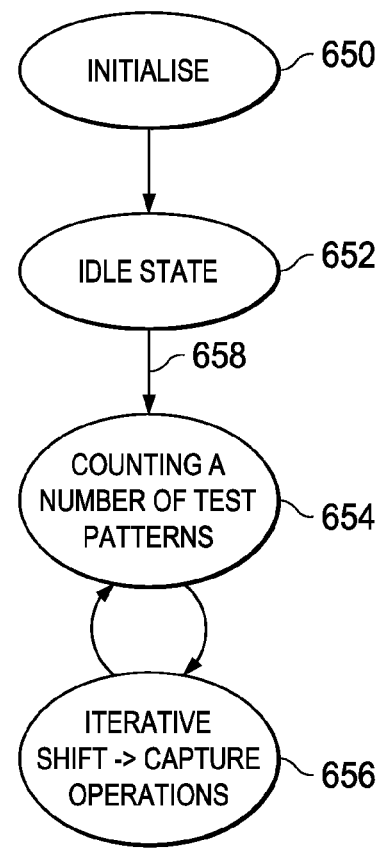
FIG. 6 is an exemplary representation of a process flow illustrating an operation of the integrated circuit of FIG. 5A according to another embodiment.

FIG. 6 is an exemplary representation of a process flow illustrating an operation of the integrated circuit (500) of FIG. 5A according to another embodiment. In FIG. 6, the plurality of states of a scan test of the integrated circuit (500) are represented by blocks (650)-(656). The plurality of states of operation include, but are not limited to, an initialize state (650), an idle state (652), a test pattern counting operation (654), and an iterative shift to capture operation (656). In an embodiment, during the initialize state (650), the scan test of the integrated circuit (500) is initialized by receiving the clock signal (510) from the tester (e.g., (102) of FIG. 1A). During the idle state (652), there are one or more wait cycles before the detection of a first shift phase.

Upon or subsequent to a detection (see, e.g., (658)) of a pattern corresponding to the first shift phase of the test pattern by the test pattern detection block (502), the pattern counter changes count state (see, e.g., (654)) by one count state, indicative of application of one test pattern (e.g., a test pattern including one shift phase and one capture phase). Upon or subsequent to the change in the count state of the pattern counter by one count state, the shift and capture operations are performed (see, e.g., (656)) as described herein with reference to FIG. 5. The transitions from the shift start count state corresponding to one of the first shift phase and a subsequent shift phase of the test pattern to the capture end count state corresponding to a capture phase of the test pattern (shown as (656)) are performed iteratively for the predetermined number of transitions (e.g., predetermined number of test patterns), by changing the count state of the pattern counter by one count state at the end of each such transition.

The scan test may involve operating STUMPS architecture (Self-Test Using MISR and PRPG Structures, where MISR is multiple input signature register and PRPG is pseudo-random pattern generator). In an embodiment, for reduction of a test time during scan tests, a scan compression may be used to increase the number of internal STUMPS while reducing the a STUMPS length, increasing an internal shift frequency, and reducing an idle time between the shift and capture phases. In another embodiment, one or more internal STUMPS may be driven by combinational scan compression logic and/or sequential scan compression logic. The one or more internal STUMPS driven by the combinational scan compression logic and/or the sequential scan compression logic may include optional MISR and PRPG elements. Additionally, in an embodiment, one or more flip-flops may be placed at the scan input pin and the scan output pin so as to support a scan shift operation at a higher frequency. The same set of flip-flops, apart from driving a test pattern into the scan chains under the control of the scan enable signal, may also be used to drive an alternate pattern into internal registers for clock and scan chain controls under the control of the load enable signal, and may also be used to drive a detection pattern for detection of a start of the shift phase.

The flip-flops at the scan input pins may be initialised at the end of the shift phase, and a test pattern in the flip-flops may be used during transferring a current test pattern out of the scan chains and preparing for application of a subsequent test pattern to the scan chain. The test pattern in the flip-flops must be retained between two consecutive shift operations. However a detection pattern indicative of start of a shift phase may occur between two test patterns. In that case, the test pattern in the flip-flops is disturbed, thereby corrupting the test pattern. In order to mitigate the above mentioned issues, the test pattern moved into the input of the flip-flops during a previous scan test cycle is preserved and re-used during the subsequent scan test cycle. In an embodiment, a detection pattern and a test pattern are passed through different sets of flip-flops and a predetermined delay is introduced subsequent to the detection of the pattern and initiation of a subsequent shift phase to preserve and re-use the previously stored test pattern. As a result, the application of the detection pattern does not disturb the states of the flip flops during application of the test pattern. An exemplary integrated circuit including the flip-flops is depicted in FIG. 7A.

Figure 7A:
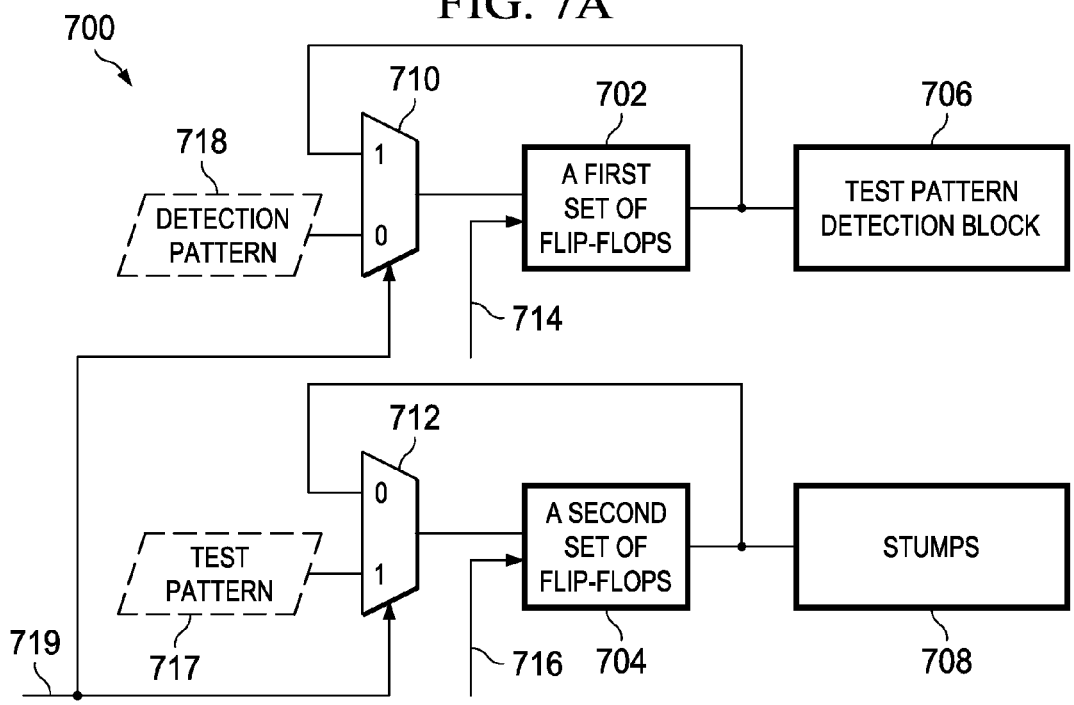
FIG. 7A illustrates an exemplary integrated circuit including a set of flip-flops capable of controlling a shift phase during a scan test, according to an embodiment.

FIG. 7A illustrates an exemplary integrated circuit (700) including one or more flip-flops capable of controlling a shift phase during a scan test, according to an embodiment. The integrated circuit (700) includes a first set of flip-flops (702) and a second set of flip flops (704), a test pattern detection block (706), STUMPs (708), a first selection block (710), and a second selection block (712). The test pattern detection block (706) may substantially be similar to the test pattern detection block (202) of FIG. 2 and may be implemented in various ways as described herein with reference to FIGS. 3A, 4A, and 5A.

The first set of flip flops (702) operates through a first clock signal (714) and the second set of flip flops operates through a second clock signal (716). The first selection block (710) is configured to receive a detection pattern (718) and the second selection block (712) is configured to receive a test pattern (717). In an embodiment, each of the first selection block (710) and the second selection block (712) are configured to receive a combination of the enable signal and the enable sync signal (719) and are triggered upon receiving the combination of the enable signal and the enable sync signal (719). The combination of enable and the enable sync signal signals (719) may be generated through a control circuit substantially similar to control circuit (206) of FIG. 2. The first selection block (710) ensures that a test mode control signal is asserted high before the start of the shift phase. The first clock signal (714) (e.g., clock signal (122) of FIG. 1B) is received from a tester (e.g., (102) of FIG. 1A). The test pattern detection block (706) is configured to receive the detection pattern (718) through the first set of flip flops (702) so as to detect a pattern corresponding to a start of a first shift phase of the test pattern (717), based on the detection pattern (718). The first set of flip flops (702) generates a first predetermined delay subsequent to receiving the detection pattern (718) and upon detection of the pattern corresponding to a shift phase by the test pattern detection block (706).

The second selection block (712) controls the transfer of test pattern (717) into to the STUMPs (708) through the second set of flip-flops (704). The second set of flip flops (704) stores a test pattern corresponding to a preceding shift phase for a second predetermined delay and enables initialization of the shift phase upon completion of the second predetermined delay. The second selection block (712) transmits the test pattern (717) into the STUMPs (708) through the second set of flip-flops (704), upon or subsequent to receiving the enable and the enable sync signals (718). The second predetermined delay in transmitting the test pattern (717) into the STUMPs (708) thereby ensures that the test mode control signal is asserted high before the start of the shift operation. An operation of the integrated circuit (700) of FIG. 7A is described herein with reference to FIG. 7B.

Figure 7B:
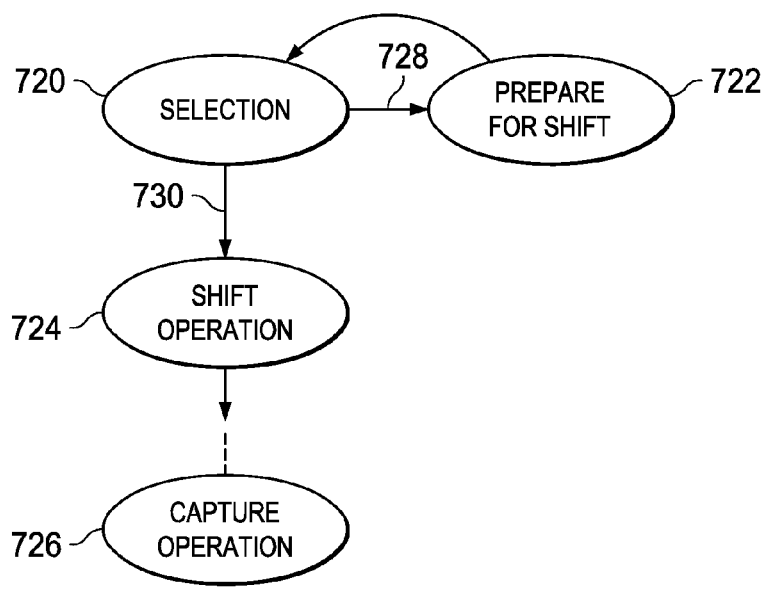
FIG. 7B is an exemplary representation of a process flow illustrating an operation of the integrated circuit of FIG. 7A according to an embodiment.

FIG. 7B is an exemplary representation of a process flow illustrating an operation of the integrated circuit (700) of FIG. 7A according to an embodiment. In FIG. 7B, the plurality of states of operation is represented by blocks (720)-(726). The plurality of states of operation include, but are not limited to, selection (720), preparing for shift (722), shift operation (724), and capture operation (726). In an embodiment, during selection (720) one of the first set of flip-flops (702) or STUMPs (706) is selected for receiving the clock signal. Upon or subsequent to selection of the first set of flip flops (702), the detection pattern (718) including information indicative of the shift phase is shifted into the test pattern detection block (706) after the first predetermined delay generated through the first set of pipeline flip-flops (702) and a pattern corresponding to the shift phase is detected (see, e.g., (728)) based on the detection pattern (718). Upon or subsequent to detection of the pattern (see, e.g., (722)) the preparation for shift operation starts and a second predetermined delay is introduced through the second set of pipeline flip-flops (704). Upon or subsequent to completion of the second predetermined delay, the STUMPs (706) are selected (see, (720)) and the second set of flip flops (704) transmits the test pattern (717) into the STUMPs (706) to initiate the subsequent shift phase (see, e.g., 730). At, (724), the shift operation is performed followed by the capture operation at (726). The shift operation and the capture operation are as described herein with reference to FIGS. 3A to 5B.

Figure 8:
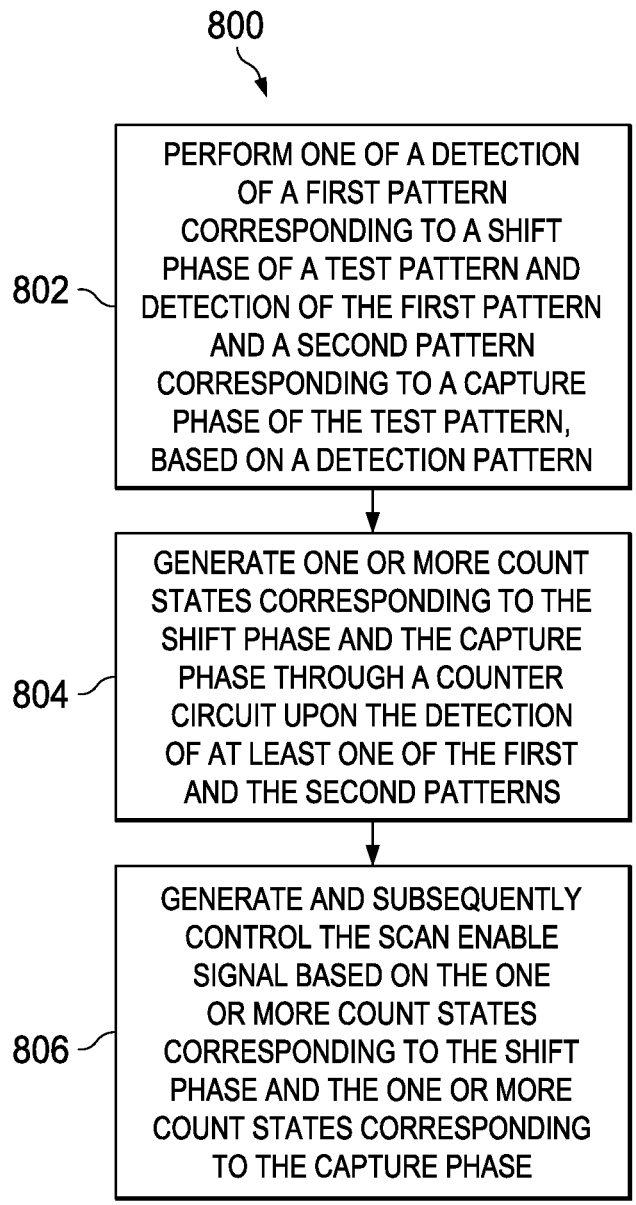
FIG. 8 depicts a flow diagram of a method of generating a test mode control signal for a scan test through a scan chain in an integrated circuit according to an embodiment.

FIG. 8 depicts a flow diagram of a method (800) of generating a test mode control signal for a scan test through a scan chain in an integrated circuit, according to an embodiment. The test mode control signal may include, but is not limited to a scan enable signal for controlling a shift phase and a capture phase of a test pattern, and a load enable signal for controlling clocks to the scan chain (e.g., scan chain (108) of FIG. 1A) within the integrated circuit, and for controlling inputs and outputs of the scan chain for selective operation of the scan chain. The method (800) starts at operation (802). At operation (802), a detection of a first pattern corresponding to a shift phase of the test pattern is performed (e.g., using test pattern detection block (202) of FIG. 2) or the detection of the first pattern corresponding to the shift phase of the test pattern and a detection of second pattern corresponding to a capture phase of the test pattern is performed (e.g., using test pattern detection block (202) of FIG. 2) based on a detection pattern. In an embodiment, first pattern (e.g., 8'hAA) and the second pattern (e.g., 8'h55) are detected in the detection pattern. The detection pattern includes information indicative of start of a shift phase of the test pattern and/or start of a capture phase of the test pattern. The test pattern includes a test vector and information indicating a number of clock cycles of a clock signal corresponding to each shift phase and each capture phase during the scan test. In an embodiment, at operation (804), one or more count states corresponding to the shift phase or one or more count states corresponding to the capture phase are generated (e.g., using one or more counters described herein with reference to FIGS. 3A, 4A and 5A) through a counter circuit (e.g., counter circuit (304) of FIG. 3A, (404) of FIG. 4A, (504) of FIG. 5A) upon or subsequent to the detection of at least one of the first and the second patterns.

The one or more count states corresponding to the shift phase are generated upon or subsequent to the detection of the first pattern and the one or more count states corresponding to the capture phase are generated upon or subsequent to the detection of the second pattern. The one or more count states corresponding to the shift phase includes count states between a shift start count state and a shift end count state. The duration between the shift start count state and the shift end count state is associated with a number of cycles of a clock signal corresponding to the shift phase. The one or more count states corresponding to the capture phase includes count states between a capture start count state and a capture end count state. The duration between the capture start count state and the capture end count state is associated with a number of cycles of the clock signal corresponding to the capture phase. In an embodiment, in operation (806), the test mode control signal is generated and subsequently controlled based on the one or more count states corresponding to the shift phase and the one or more count states corresponding to the capture phase. The generation and control of the test mode control signal is described herein with reference to FIGS. 3A-7B.

In an embodiment, upon detection of the pattern corresponding to the shift phase a count state of a first counter is generated as the shift start count state. The test mode control signal is asserted if the count state of the first counter is the first pre-determined count state. The count state of the first counter is changed from the shift start count state to a shift end count state during the shift phase of the scan test. The test mode control signal is de-asserted if the count state of the first counter is changed to the shift end count state. One or more count states of a wait counter of the counter circuit are generated corresponding to one or more wait cycles if the count state of the first counter is the shift end count state. A count state of a second counter of the counter circuit is generated as the capture start count state after the end of the one or more wait cycles. The count state of the second counter is changed from the capture start count state to the capture end count state during the capture phase and this embodiment is described herein with reference to FIGS. 4A-4B.

In an embodiment, for one or more count states corresponding to a predetermined number of transitions between from the shift start count state corresponding to the shift phase of the test pattern to the capture end count state corresponding to the capture phase of the test pattern, one or more count states of a first wait counter corresponding to a first wait cycle is generated upon one of detection of the pattern corresponding to a first shift phase and a change in a count state of a pattern counter by one count state. A count state of a first counter of the counter circuit is generated as the shift start count state after the end of the first wait cycle. The test mode control signal is asserted if the count state of the first counter is the shift start count state. The count state of the first counter is changed from the shift start count state to the shift end count state. The test mode control signal is de-asserted if the count state of the first counter is changed to the shift end count state. The one or more count states of a second wait counter corresponding to a second wait cycle is generated if the count state of the first counter is the shift end count state. A count state of a second counter of the counter circuit is generated as the capture start count state after the end of the second wait cycle. The count state of the second counter is changed from the capture start count state to the capture end count state during the capture phase of the scan test. The one or more count states of the pattern counter of the counter circuit corresponding to the predetermined number of transitions between from the shift start count state corresponding to the shift phase of the test pattern to the capture end count state corresponding to the capture phase of the test pattern is changed by one count state, and this embodiment is described herein with reference to FIGS. 5A-5B.

Additionally in an embodiment, for one or more count states corresponding to the predetermined number of transitions from the shift start count state corresponding to one of the first shift phase and a subsequent shift phase of the test pattern to the capture end count state corresponding to a capture phase of the test pattern, one or more count states of a pattern counter of the counter circuit is changed by one count state upon one of detection of a first shift phase and end of a previous capture phase. A count state of a first counter of the counter circuit is generated as the shift start count state upon changing the one or more count states of the pattern counter by one count state. The test mode control signal is asserted if the count state of the first counter is the shift start count state. The count state of the first counter is changed from the shift start count state to the shift end count state during the shift phase of the scan test. The test mode control signal is de-asserted if the count state of the first counter is changed to the shift end count state. A count state of a second counter of the counter circuit is changed from the capture start count state to the capture end count state during the capture phase of the scan test and this embodiment is described herein with reference to FIG. 6.

Without in any way limiting the scope, interpretation, or application of the claims appearing below, advantages of one or more of the exemplary embodiments disclosed herein include use of additional circuit inside the integrated circuit for internal scan enable generation and control during the application of scan patterns. The present technology enables higher multi-site test by releasing the pin, and eliminates the need for dead cycles to synchronize one or more tester controlled pins and test data during the transfer of data between the integrated circuit and the tester based on an event driven direct memory access architecture. The present technology has benefits not only for the event driven direct memory access based tester architecture, but for all testers that function based on data transfer using a memory refreshed using direct memory access architecture.

Although the present technology has been described with reference to specific exemplary embodiments, it is noted that various modifications and changes are made to these embodiments without departing from the broad spirit and scope of the present technology. For example, the various devices, modules, analyzers, generators, etc., described herein is enabled and operated using hardware circuitry (e.g., a complementary metal oxide semiconductor (CMOS) based logic circuitry), and/or any combination of hardware and software (e.g., embodied in a machine readable medium). For example, the various electrical structures may be embodied using transistors, logic gates, and electrical circuits (e.g., ASIC circuitry and/or in Digital Signal Processor (DSP) circuitry) and drawings are to be regarded in an illustrative rather than a restrictive sense.

Also, the circuits described and illustrated in the various embodiments as discrete or separate are combined or integrated with other systems, modules, without departing from the scope of the present technology. Other items shown or discussed as directly coupled or communicating with each other is coupled through some interface or device, such that the items may no longer be considered directly communicatively associated or coupled with each other but may still be indirectly coupled and in communication, whether electrically, mechanically, or otherwise, with one another. Other examples of changes, substitutions, and alterations ascertainable by one skilled in the art, upon studying the exemplary embodiments disclosed herein, may be made without departing from the spirit and scope of the present technology.

The invention claimed is:

1. An integrated circuit configured to generate a test mode control signal for a scan test through a scan chain in the integrated circuit, the integrated circuit comprising:
   a test pattern detection block configured to:
      receive a detection pattern;
      perform a detection of a first pattern corresponding to a shift phase of a test pattern and a second pattern corresponding to a capture phase of the test pattern, based on the detection pattern; and
      generate a trigger signal based on the detection of at least one of the first and second patterns;
   a control circuit coupled to the test pattern detection block, the control circuit configured to receive the trigger signal and generate and control the test mode control signal based on one or more count states corresponding to the shift phase and one or more count states corresponding to the capture phase; and
   a counter circuit coupled to the control circuit, the counter circuit configured to generate one or more count states corresponding to the shift phase and a clock signal and one or more count states corresponding to the capture phase and the clock signal based on at least one of the first and second patterns.

2. The integrated circuit of claim 1, wherein the control circuit is further configured to perform at least one of:
   assertion of the test mode control signal upon a count state of the counter circuit being one of a shift start count state and a capture end count state; and
   de-assertion of the test mode control signal upon the count state being one of a capture start count state and a shift end count state.

3. The integrated circuit of claim 2, wherein the counter circuit comprises:
   a register block coupled to the control circuit, the register block configured to store at least one of the shift start count state, the shift end count state, the capture start count state, and the capture end count state.

4. The integrated circuit of claim 3, wherein the counter circuit further comprises:
   one or more counters coupled with the register block, configured to:
      generate the one or more count states corresponding to the shift phase from the shift start count state to the shift end count state; and
      generate the one or more count states corresponding to the capture phase from the capture start count state to the capture end count state.

5. The integrated circuit of claim 3, wherein the counter circuit further comprises:
   a first counter configured to generate one or more count states from the shift start count state to the shift end count state;
   a second counter configured to generate the one or more count states from the capture start count state to the capture end count state; and one or more counters configured to generate one or more count states corresponding to one or more wait cycles before the start of the shift phase, and one or more count states corresponding to one or more wait cycles before the start of the capture phase.

6. The integrated circuit of claim 5, wherein the counter circuit further comprising a pattern counter configured to generate one or more count states corresponding to a predetermined number of transitions from the shift start count state corresponding to the shift phase of the test pattern to the capture end count state corresponding to the capture phase of the test pattern.

7. The integrated circuit of claim 1, further comprising:
a first set of flip flops coupled with the test pattern detection block configured to generate a first predetermined delay upon the detection of the first pattern corresponding to the shift phase; and
a second set of flip flops coupled with the scan chain for storing a test pattern corresponding to a preceding shift phase for a second predetermined delay and enabling initialization of the shift phase upon completion of the second predetermined delay.

8. The integrated circuit of claim 3, further comprising a test interface communicatively associated or coupled with the register block for controlling the register block and changing at least one of the shift start count state, the capture start count state, the shift end count state, and the capture end count state based on the test pattern.

9. The integrated circuit of claim 1, wherein the test mode control signal comprises one of a scan enable signal for controlling the shift phase and the capture phase of the test pattern and a load enable signal for controlling operation of the scan chain.

10. An integrated circuit configured to generate a test mode control signal for a scan test through a scan chain in the integrated circuit, the integrated circuit comprising:
a test pattern detection block configured to:
receive a detection pattern;
perform a detection of a pattern corresponding to a first shift phase of a test pattern, based on the detection pattern; and
generate a trigger signal based on the detection of the pattern;
a control circuit coupled to the test pattern detection block, the control circuit configured to receive the trigger signal and generate and control the test mode control signal based on one or more count states corresponding to the first shift phase and one or more count states corresponding to a subsequent shift phase and a capture phase; and
a counter circuit coupled to the control circuit, the counter circuit comprising:
a pattern counter configured to be triggered upon a detection of the first shift phase, the pattern counter configured to generate one or more count states corresponding to a predetermined number of transitions from a shift start count state corresponding to one of the first shift phase and a subsequent shift phase of the test pattern to a capture end count state corresponding to a capture phase of the test pattern, and
one or more counters coupled with the pattern counter, the one or more counters configured to generate one or more count states corresponding to the first shift phase, the subsequent shift phase and the capture phase.

11. The integrated circuit of claim 10, wherein the control circuit is further configured to perform at least one of:
assertion of the test mode control signal upon a count state of the counter circuit being one of the shift start count state and the capture end count state; and
de-assertion of the test mode control signal upon the count state being one of a capture start count state and a shift end count state.

12. The integrated circuit of claim 10, wherein the counter circuit comprises:
a register block configured to store at least one of the shift start count state, the capture start count state, the shift end count state, and the capture end count state.

13. The integrated circuit of claim 12, wherein the counter circuit further comprises:
one or more counters configured to generate one or more count states corresponding to one or more wait cycles before the start of one of the first shift phase and the subsequent shift phase and one or more wait cycles before the start of the capture phase, wherein the generation of the test mode control signal is further based on the one or more count states of the one or more counters.

14. The integrated circuit of claim 10, further comprising:
a first set of flip flops coupled with the test pattern detection block configured to generate a first predetermined delay upon the detection of the pattern corresponding to the first shift phase; and
a second set of flip flops coupled with the scan chain for storing a test pattern corresponding to a preceding shift phase for a second predetermined delay and enabling initialization of the shift phase upon completion of the second predetermined delay.

15. The integrated circuit of claim 12, further comprising a test interface communicatively associated or coupled with the register block for controlling the register block and changing at least one of the shift start count state, the capture start count state, the shift end count state, and the capture end count state based on the test pattern.

16. The integrated circuit of claim 10, wherein the test mode control signal comprises one of a scan enable signal for controlling the shift phase and the capture phase of the test pattern and a load enable signal for controlling operation of the scan chain.

17. A method of generating a test mode control signal for a scan test through a scan chain in an integrated circuit, the method comprising:
detecting a first pattern corresponding to a shift phase of a test pattern and detection of the first pattern and a second pattern corresponding to a capture phase of the test pattern, based a detection pattern;
generating one or more count states corresponding to the shift phase and one or more count states corresponding to the capture phase through a counter circuit upon the detection of the first and second patterns, the one or more count states corresponding to the shift phase comprising count states between a shift start count state and a shift end count state, the shift start count state being associated with a number of cycles of a clock signal corresponding to the shift phase, the one or more count states corresponding to the capture phase comprising count states between a capture start count state and a capture end count state, and the capture start count state being associated with a number of cycles of the clock signal corresponding to the capture phase; and
generating and subsequently controlling the test mode control signal based on the one or more count states corresponding to the shift phase and the one or more count states corresponding to the capture phase.

18. The method of claim 17, further comprising performing iteratively:
- generating a count state of a first counter of the counter circuit as the shift start count state upon detection of the first pattern corresponding to the shift phase;
- asserting the test mode control signal if the count state of the first counter is the shift end count state;
- changing the one or more count states of the first counter from the shift start count state to the shift end count state during the shift phase of the scan test;
- de-asserting the test mode control signal if the count state of the first counter is changed to the shift end count state;
- generating one or more count states of a wait counter of the counter circuit corresponding to one or more wait cycles upon the count state of the first counter being the shift end count state;
- generating a count state of a second counter of the counter circuit as the capture start count state after the end of the one or more wait cycle; and
- changing the count states of the second counter from the capture start count state to the capture end count state during the capture phase.

19. The method of claim 17, further comprising performing iteratively for one or more count states corresponding to a predetermined number of transitions between from the shift start count state corresponding to the shift phase of the test pattern to the capture end count state corresponding to the capture phase of the test pattern:
- generating one or more count states of a first wait counter corresponding to a first wait cycle upon one of: detection of the pattern corresponding to a first shift phase and a change in a count state of a pattern counter by one count state;
- generating a count state of a first counter of the counter circuit as the shift start count state after the end of the first wait cycle;
- asserting the test mode control signal if the count state of the first counter is the shift start count state;
- changing the count state of the first counter from the shift start count state to the shift end count state;
- de-asserting the test mode control signal if the count state of the first counter is changed to the shift end count state;
- generating one or more count states of a second wait counter corresponding to a second wait cycle upon the count state being the shift end count state;
- generating a count state of a second counter of the counter circuit as the capture start count state after the end of the second wait cycle;
- changing the count state of the second counter from the capture start count state to the capture end count state during the capture phase of the scan test; and
- changing one or more count states of a pattern counter of the counter circuit corresponding to the predetermined number of transitions from the shift start count state of the shift phase of the test pattern to the capture end count state of the capture phase of the test pattern by one count state.

20. The method of claim 17, further comprising performing iteratively for one or more count states corresponding to a predetermined number of transitions from the shift start count state corresponding to the shift phase of the test pattern to the capture end count state corresponding to the capture phase of the test pattern:
- changing one or more count states of a pattern counter of the counter circuit corresponding to the predetermined number of transitions by one count state upon one of detection of a first shift phase and end of a previous capture phase;
- generating a count state of a first counter of the counter circuit as the shift start count state upon changing the one or more count states by one count state;
- asserting the test mode control signal if the count state of the first counter is the shift start count state;
- changing the count state of the first counter from the shift start count state to the shift end count state during the shift phase of the scan test;
- de-asserting the test mode control signal if the count state of the first counter is changed to the shift end count state; and
- changing the count state of a second counter of the counter circuit from the capture start count state to the capture end count state during the capture phase of the scan test.

* * * * *